United States Patent
Shin et al.

(10) Patent No.: US 9,520,497 B2
(45) Date of Patent: Dec. 13, 2016

(54) SEMICONDUCTOR DEVICES INCLUDING A STRESSOR IN A RECESS AND METHODS OF FORMING THE SAME

(71) Applicants: Dong-Suk Shin, Yongin-si (KR); Chul-Woong Lee, Suwon-si (KR); Hoi-Sung Chung, Hwaseong-si (KR); Young-Tak Kim, Hwaseong-si (KR); Nae-In Lee, Seoul (KR)

(72) Inventors: Dong-Suk Shin, Yongin-si (KR); Chul-Woong Lee, Suwon-si (KR); Hoi-Sung Chung, Hwaseong-si (KR); Young-Tak Kim, Hwaseong-si (KR); Nae-In Lee, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/951,932

(22) Filed: Nov. 25, 2015

(65) Prior Publication Data

US 2016/0079424 A1 Mar. 17, 2016

Related U.S. Application Data

(63) Continuation of application No. 14/938,172, filed on Nov. 11, 2015, now Pat. No. 9,397,216, which is a (Continued)

(30) Foreign Application Priority Data

Nov. 22, 2012 (KR) ........................ 10-2012-0133248

(51) Int. Cl.
*H01L 29/66* (2006.01)
*H01L 29/78* (2006.01)
(Continued)

(52) U.S. Cl.
CPC ... *H01L 29/7848* (2013.01); *H01L 21/823412* (2013.01); *H01L 21/823425* (2013.01);
(Continued)

(58) Field of Classification Search
CPC ........... H01L 29/7848; H01L 29/66636; H01L 21/823807; H01L 21/823814; H01L 29/6659; H01L 29/7834; H01L 29/78; H01L 29/7833; H01L 21/26506; H01L 21/30608; H01L 21/823412; H01L 21/02532; H01L 29/4236
(Continued)

(56) References Cited

U.S. PATENT DOCUMENTS 7,064,039 B2  6/2006  Liu
7,354,835 B2  4/2008  Shin et al.
(Continued)

FOREIGN PATENT DOCUMENTS

JP  2009-117429  5/2009
JP  2009-123961  6/2009
(Continued)

*Primary Examiner* — Sonya D McCall Shepard
(74) *Attorney, Agent, or Firm* — Myers Bigel, P.A.

(57) ABSTRACT

Semiconductor devices including a stressor in a recess and methods of forming the semiconductor devices are provided. The methods may include forming a fast etching region comprising phosphorous in an active region and forming a first trench in the active region by recessing the fast etching region. The methods may also include forming a second trench in the active region by enlarging the first trench using a directional etch process and forming a stressor in the second trench. The second trench may include a notched portion of the active region.

30 Claims, 37 Drawing Sheets

Related U.S. Application Data continuation of application No. 14/033,639, filed on Sep. 23, 2013, now Pat. No. 9,214,530.

(51) Int. Cl.
| | |
|---|---|
| *H01L 21/8234* | (2006.01) |
| *H01L 21/8238* | (2006.01) |
| *H01L 29/04* | (2006.01) |
| *H01L 29/06* | (2006.01) |
| *H01L 27/088* | (2006.01) |
| *H01L 29/08* | (2006.01) |
| *H01L 29/165* | (2006.01) |
| *H01L 29/167* | (2006.01) |

(52) U.S. Cl.
CPC ............ *H01L 21/823468* (2013.01); *H01L 21/823807* (2013.01); *H01L 21/823814* (2013.01); *H01L 21/823864* (2013.01); *H01L 27/088* (2013.01); *H01L 29/045* (2013.01); *H01L 29/0603* (2013.01); *H01L 29/0653* (2013.01); *H01L 29/0847* (2013.01); *H01L 29/165* (2013.01); *H01L 29/167* (2013.01); *H01L 29/6656* (2013.01); *H01L 29/66545* (2013.01); *H01L 29/66568* (2013.01); *H01L 29/66636* (2013.01); *H01L 29/7833* (2013.01); *H01L 29/7834* (2013.01)

(58) Field of Classification Search
USPC .......... 257/336, 344, 408, E29.012, E29.278,257/E21.435; 438/233, 300, 301, 302, 652–656, 438/704, 706, 713, 734, 735, 738, 745
See application file for complete search history.

(56) References Cited

U.S. PATENT DOCUMENTS

| | | | |
|---|---|---|---|
| 7,358,551 B2 | 4/2008 | Chidambarrao et al. | |
| 7,538,387 B2 | 5/2009 | Tsai | |
| 7,554,110 B2 * | 6/2009 | Yu | H01L 29/045 257/18 |
| 7,557,396 B2 | 7/2009 | Ando | |
| 7,652,328 B2 | 1/2010 | Yamasaki et al. | |
| 7,652,332 B2 | 1/2010 | Cartier et al. | |
| 7,683,405 B2 | 3/2010 | Son et al. | |
| 7,781,799 B2 | 8/2010 | Yu et al. | |
| 7,833,852 B2 | 11/2010 | Winstead et al. | |
| 8,012,820 B2 | 9/2011 | Majumdar et al. | |
| 8,035,141 B2 | 10/2011 | Chan et al. | |
| 8,039,350 B2 | 10/2011 | Son et al. | |
| 8,062,948 B2 | 11/2011 | Shin | |
| 8,120,120 B2 | 2/2012 | Yang et al. | |
| 8,269,256 B2 | 9/2012 | Tamura | |
| 8,278,166 B2 | 10/2012 | Chen et al. | |
| 8,304,318 B2 | 11/2012 | Son et al. | |
| 9,029,912 B2 | 5/2015 | Lee et al. | |
| 2005/0148147 A1 | 7/2005 | Keating et al. | |
| 2006/0234455 A1 | 10/2006 | Chen et al. | |
| 2008/0242037 A1 | 10/2008 | Sell et al. | |
| 2008/0315254 A1 | 12/2008 | Fukuda et al. | |
| 2010/0244155 A1 * | 9/2010 | Carter | H01L 21/823807 257/410 |
| 2011/0024801 A1 | 2/2011 | Cheng et al. | |
| 2011/0024804 A1 | 2/2011 | Chang et al. | |
| 2011/0121363 A1 | 5/2011 | Cheng et al. | |
| 2011/0237039 A1 | 9/2011 | Yang et al. | |
| 2011/0316044 A1 | 12/2011 | Chan et al. | |
| 2012/0045878 A1 | 2/2012 | Tamura | |
| 2012/0058610 A1 | 3/2012 | Ookoshi et al. | |
| 2012/0094448 A1 | 4/2012 | Yeh et al. | |
| 2012/0100681 A1 | 4/2012 | Fang et al. | |
| 2012/0108021 A1 | 5/2012 | Mehrotra | |
| 2012/0146142 A1 | 6/2012 | Zhu et al. | |
| 2012/0164809 A1 | 6/2012 | Yoon et al. | |
| 2012/0205715 A1 | 8/2012 | Kwok et al. | |
| 2012/0309176 A1 | 12/2012 | Tamura | |
| 2014/0141589 A1 | 5/2014 | Shin | |
| 2015/0228791 A1 | 8/2015 | Lee et al. | |

FOREIGN PATENT DOCUMENTS

| | | |
|---|---|---|
| JP | 2011-151318 | 8/2011 |
| KR | 1020050005885 | 1/2005 |

* cited by examiner

SEMICONDUCTOR DEVICES INCLUDING A STRESSOR IN A RECESS AND METHODS OF FORMING THE SAME

CROSS-REFERENCE TO RELATED APPLICATION

This U.S. non-provisional patent application is a continuation of U.S. patent application Ser. No. 14/938,172, filed Nov. 11, 2015, which itself is a continuation of U.S. patent application Ser. No. 14/033,639, filed Sep. 23, 2013, which itself claims priority under 35 U.S.C. §119 to Korean Patent Application No. 10-2012-0133248, filed on Nov. 22, 2012 in the Korean Intellectual Property Office, the disclosures of which are incorporated by reference herein in their entireties.

FIELD

The present disclosure generally relates to the field of electronics, and more particularly, to semiconductor devices.

BACKGROUND

To improve electrical characteristics of semiconductor devices, a variety of strain technologies have been developed.

SUMMARY

A method of forming a semiconductor device may include forming a lightly doped drain (LDD) in an active region in a substrate and forming a fast etching region including phosphorous in the LDD. The method may also include forming a first trench in the active region by recessing the fast etching region and forming a second trench in the active region by enlarging the first trench using a directional etch process. The second trench may include a notched portion of the active region. The method may further include forming a stressor in the second trench and forming a gate electrode on the active region. In various embodiments, the LDD may include boron.

According to various embodiments, forming the first trench may include performing an isotropic etch process. The first trench may include an upper trench formed by recessing the fast etching region and a lower trench connected to a lower portion of the upper trench. The lower trench may have a first width narrower than a second width of the upper trench. In various embodiments, forming the first trench further may include performing an anisotropic etch process before performing the isotropic etch process.

According to various embodiments, the notched portion of the active region may include an upper sidewall and a lower sidewall contacting the upper sidewall. An angle between an uppermost surface of the active region and the upper sidewall may be an acute angle and the upper sidewall may be non-coplanar with the lower sidewall. In various embodiments, the upper sidewall may contact the lower sidewall at a convergence interface on a surface of the LDD. The gate electrode may overlap the convergence interface of the upper and lower sidewalls and an edge portion of the upper sidewall may protrude beyond an adjacent sidewall of the gate electrode.

In various embodiments, a width of the fast etching region may be narrower than a width of the LDD. A first depth of the fast etching region may be shallower than a second depth of the LDD. A portion of the LDD may be formed between the active region and the fast etching region. A portion of the fast etching region may be between the LDD and the stressor, after forming the stressor.

According to various embodiments, the method may further include forming a preliminary gate electrode on the active region and a spacer on a sidewall of the preliminary gate electrode before forming the LDD and removing the preliminary gate electrode after forming the stressor.

According to various embodiments, the method may further include forming a preliminary gate electrode on the active region and a spacer on a sidewall of the preliminary gate electrode before forming the fast etching region and removing the preliminary gate electrode after forming the stressor.

In various embodiments, the method may further include forming a preliminary gate electrode on the active region and a spacer on a sidewall of the preliminary gate electrode before forming the first trench and removing the preliminary gate electrode after forming the stressor.

According to various embodiments, forming the stressor may include forming a first semiconductor layer in the second trench, forming a second semiconductor layer on the first semiconductor layer and forming a third semiconductor layer on the second semiconductor layer. The first and second semiconductor layers may include a material absent from the active region. Forming the first, second and third semiconductor layers may include performing selective epitaxial growth (SEG) processes. According to various embodiments, the first and second semiconductor layers may include respective silicon germanium layers, and a germanium concentration of the second semiconductor layer may be greater than that of the first semiconductor layer. The third semiconductor layer may include a Si layer.

A method of forming a semiconductor device may include forming a first lightly doped drain (LDD) in a first active region and a second LDD in a second active region and forming a first fast etching region in the first LDD of the first active region and a second fast etching region in the second LDD of the second active region. The first active region may be in a first region of a substrate and the second active region may be in a second region of the substrate. The first and second fast etching regions may include phosphorous. The method may also include forming a first preliminary trench and a second preliminary trench by recessing the first and second fast etching regions, respectively, and forming a first trench and a second trench by enlarging the first and second preliminary trenches, respectively, using a directional etch process. The first trench may include a first notched portion of the first active region and the second trench may include a second notched portion of the second active region. The method may further include forming a first stressor in the first trench and a second stressor in the second trench and forming a first gate electrode on the first active region and a second gate electrode on the second active region.

According to various embodiments, the first notched portion of the first active region may include a first upper sidewall contacting a first lower sidewall at a first convergence interface and the second notched portion of the second active region may include a second upper sidewall contacting a second lower sidewall at a second convergence interface. The first gate electrode may overlap the first convergence interface and the second gate electrode may not overlap the second convergence interface. The first convergence interface may be higher than the second convergence interface.

In various embodiments, a horizontal distance between the first convergence interface and a sidewall of the first gate electrode may be in a range of 0 nm to 5 nm, and a horizontal distance between the second convergence interface and a sidewall of the second gate electrode may be in a range of 1 nm to 3 nm.

In various embodiments, a vertical distance between the first convergence interface and an uppermost surface of the first active region may be in a range of 3 nm to 7 nm and a vertical distance between the second convergence interface and an uppermost surface of the second active region may be in a range of 8 nm to 12 nm.

According to various embodiments, the first convergence interface may be formed on a surface of the first LDD, and the second convergence interface may be formed on a surface of the second LDD and wherein a boron concentration of the second LDD may be greater than a boron concentration of the first LDD.

In various embodiments, a phosphorous concentration of the second fast etching region may be less than a phosphorous concentration of the first fast etching region.

A semiconductor device may include a substrate including first and second regions, a first gate electrode on a first active region in the first region, a first trench in the first active region adjacent a side of the first gate electrode and a first embedded stressor in the first trench. The device may also include a second gate electrode on a second active region in the second region, a second trench in the second active region adjacent a side of the second gate electrode and a second embedded stressor in the second trench. The first and second regions may include different respective pattern densities. The first active region may include a first notched portion of the first active region and the second trench may include a second notched portion of the second active region. The first notched portion may include a first upper sidewall and a first lower sidewall contacting the first upper sidewall, and the first upper sidewall and the first lower sidewall may converge at a first convergence interface. The second notched portion may include a second upper sidewall and a second lower sidewall contacting the second upper sidewall, and the second upper sidewall and the second lower sidewall may converge at a second convergence interface. The first gate electrode may overlap the first convergence interface and the second gate electrode may not overlap the second convergence interface and the first convergence interface may be higher than the second convergence interface.

A semiconductor device may include a substrate including an active region, a gate electrode on the active region and a lightly doped drain (LDD) in the active region adjacent a side of the gate electrode, the LDD including boron and phosphorous. A concentration of the phosphorous may be in a range of 5E18 atoms/cm3 to 1E19 atoms/cm3. The device may also include trench in the active region adjacent the side of the gate electrode, the trench including a notched portion of the active region and an embedded stressor in the trench.

A method of forming a semiconductor device may include forming a gate structure on a substrate and forming a doped pattern adjacent a side of the gate structure in the substrate. The method may also include forming a first preliminary cavity by etching a portion of the doped pattern using the gate structure as an etch mask, forming a second preliminary cavity by selectively etching the doped pattern, forming a cavity by etching exposed surfaces of the second preliminary cavity using a directional etch process and forming a stressor in the cavity. A side of the first preliminary cavity may expose the doped pattern. The cavity may include a recess under the gate structure and the recess may include two converging sloped portions.

In various embodiments, forming the doped pattern may include implanting elements into the substrate using the gate structure as an implant mask. Implanting the elements may include implanting phosphorous into the substrate According to various embodiments, the method may further include forming a lightly doped drain (LDD) in the substrate adjacent the side of the gate structure before forming the doped pattern. At least a portion of the doped pattern may be formed in the LDD. The method may additionally include forming a spacer pattern on a side of the gate structure after forming the LDD. Implanting the elements may include implanting the elements using the spacer pattern and the gate structure as an implant mask In various embodiments, the directional etch process may include an etch process etching the substrate at a plurality of different etch rates according to crystal orientations of the substrate and the recess may include a notched portion including the two conversing sloped portions.

DETAILED DESCRIPTION

Figure 1:
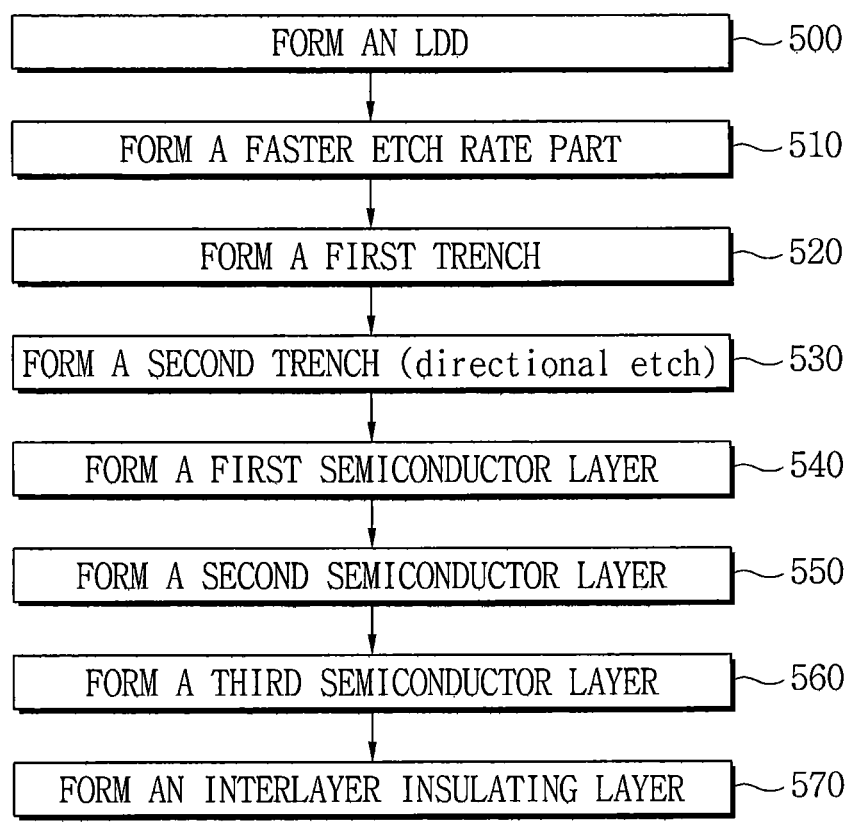
FIG. 1 is a flowchart illustrating a method of forming a semiconductor device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added or inserted between the blocks that are illustrated, and/or blocks/operations may be omitted without departing from the scope of the present inventive concepts.

Although a transistor including a stressor in a recess may improve carrier mobility, there may be large variations in sizes and shapes of recesses within a device. Various embodiments of the present inventive concepts, however, provide methods of forming a semiconductor device, the methods including forming a faster etch rate part which may enable control of a size and a shape of a recess. Accordingly, the methods described herein may reduce variations in sizes and shapes of recesses within a device.

FIG. 1 is a flowchart illustrating a method of forming a semiconductor device according to some embodiments of the present inventive concepts. FIGS. 2, 3, 4A, 4B, 5A-5C, 6A-6C, 7A-7C, 8A-8C, 9-13 and 14A-14G are cross-sectional views illustrating intermediate structures provided in operations of forming a semiconductor device according to some embodiments of the present inventive concepts.

Referring to FIG. 1, a method of forming a semiconductor device according to some embodiments of the present inventive concepts may include forming a lightly doped drain (LDD) (Block 500), forming a faster etch rate part (Block 510), forming a first trench (Block 520), forming a second trench (Block 530), forming a first semiconductor layer (Block 540), forming a second semiconductor layer (Block 550), forming a third semiconductor layer (Block 560), and forming an interlayer insulating layer (Block 570).

Figure 2:
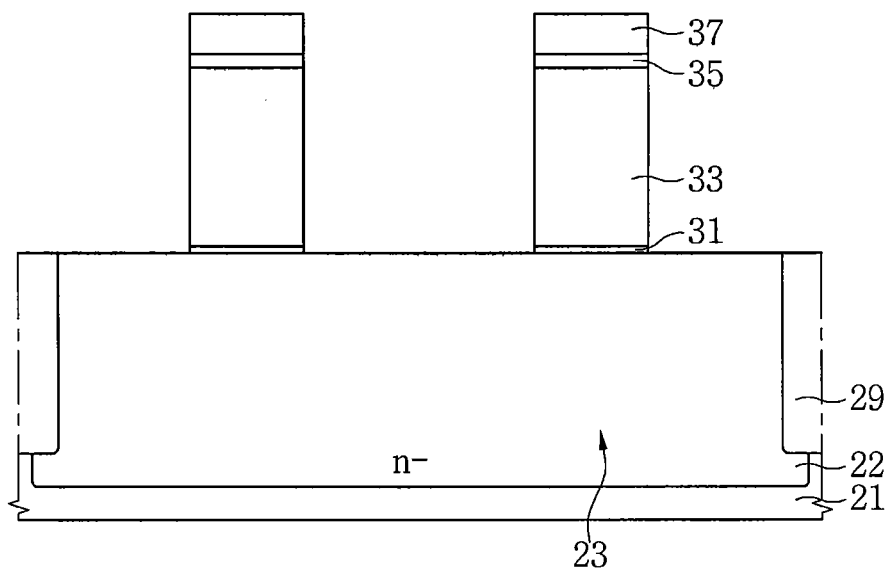
FIGS. 2, 3, 4A, 4B, 5A-5C, 6A-6C, 7A-7C, 8A-8C, 9-13 and 14A-14G are cross-sectional views illustrating intermediate structures provided in operations of forming a semiconductor device according to some embodiments of the present inventive concepts.

Referring to FIGS. 1 and 2, a well 22, an active region 23, a device isolation layer 29, a buffer layer 31, a temporary gate electrode 33, a first mask pattern 35, and a second mask pattern 37 may be formed on a substrate 21. The substrate 21 may be a single-crystalline semiconductor substrate such as a silicon wafer or a silicon on insulator (SOI) wafer. The substrate 21 may include first conductivity-type impurities. The well 22 may include second conductivity-type impurities different from the first conductivity-type impurities.

Hereinafter, the description will be made under the assumption that the first conductivity-type is p-type and the second conductivity-type is n-type. In some embodiments, however, the first conductivity-type may be n-type and the second conductivity type may be p-type. For example, the substrate 21 may be single crystalline silicon including p-type impurities, and the well 22 is single crystalline silicon including n-type impurities. The substrate 21 may include boron (B), and the well 22 may include As, P, or a combination thereof.

The active region 23 may be confined to the well 22 by the device isolation layer 29. The active region 23 may include single crystalline silicon including n-type impurities. The device isolation layer 29 may be formed using a shallow trench isolation (STI) technique. The device isolation layer 29 may include an insulating layer such as silicon oxide, silicon nitride, silicon oxy-nitride, or a combination thereof. The buffer layer 31 may be interposed between the active region 23 and the temporary gate electrode 33. The buffer layer 31 may include an insulating layer such as silicon oxide, silicon nitride, silicon oxy-nitride, or a combination thereof. For example, the buffer layer 31 may include silicon oxide.

The temporary gate electrode 33 may be formed to cross the active region 23. The temporary gate electrode 33 may cross the active region 23 and the device isolation layer 29. The temporary gate electrode 33 may include polysilicon. In some embodiments, the temporary gate electrode 33 may include an insulating layer. The first mask pattern 35 may be formed on the temporary gate electrode 33. The first mask pattern 35 may include a material having an etch selectivity with respect to the temporary gate electrode 33. The second mask pattern 37 may be formed on the first mask pattern 35. The second mask pattern 37 may include a material having an etch selectivity with respect to the first mask pattern 35. For example, the first mask pattern 35 may include silicon oxide. The second mask pattern 37 may include silicon nitride or polysilicon. In some embodiments, one of the first mask pattern 35 and the second mask pattern 37 may be omitted.

Sides of the second mask pattern 37, first mask pattern 35, temporary gate electrode 33, and buffer layer 31 may be vertically aligned. The second mask pattern 37, the first mask pattern 35, the temporary gate electrode 33, and the buffer layer 31 may be referred to as a temporary gate pattern 31, 33, 35, and 37. The temporary gate pattern 31, 33, 35, and 37 may cross the active region 23. A plurality of the temporary gate patterns 31, 33, 35, and 37 may be formed in parallel on the active region 23.

Figure 3:
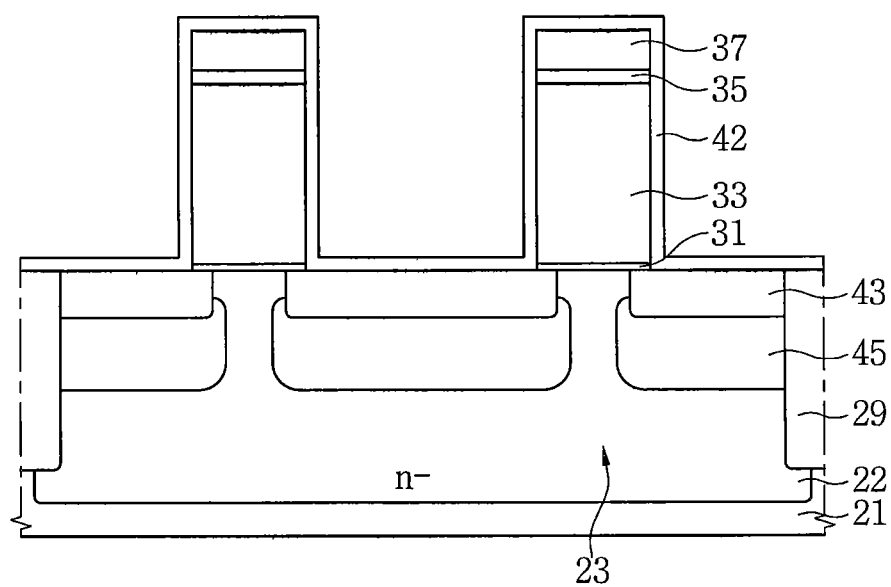

Referring to FIGS. 1 and 3, a first spacer 42 may be formed on a sidewall of the temporary gate electrode 33. A lightly doped drain (LDD) 43 may be formed by implanting the first conductivity-type impurities in the active region 23 using the first spacer 42, the second mask pattern 37, the first mask pattern 35, and the temporary gate electrode 33 as an ion-implantation mask (Block 500). For example, the formation of the LDD 43 may be done at a dose of 1E13 to 5E14 atoms/cm2 of $BF_2$ and an ion-implantation energy of 2 to 5 Kev. The LDD 43 may include boron. A halo 45 may be formed by implanting the second conductivity-type impurities to the active region 23. The halo 45 may cover a side and a bottom of the LDD 43. The formation of the LDD 43 and the halo 45 may include an ion-implantation process and a heat treatment process.

The first spacer 42 may conformally cover an upper surface of the substrate 21. For example, the first spacer 42 may cover upper and side surfaces of the temporary gate pattern 31, 33, 35, and 37, and cover the active region 23 and the device isolation layer 29 with a constant thickness. The first spacer 42 may include an insulating layer such as silicon oxide, silicon nitride, silicon oxy-nitride, or a combination thereof. The first spacer 42 may include a material having an etch selectivity with respect to the temporary gate electrode 33. For example, the first spacer 42 may include silicon nitride. The LDD 43 may be formed to reach a certain depth from an upper surface of the active region 23. The LDD 43 may partially overlap a bottom of the temporary gate pattern 31, 33, 35, and 37. The LDD 43 may be formed at a desired position by adjusting the thickness of the first spacer 42.

Figure 4A:
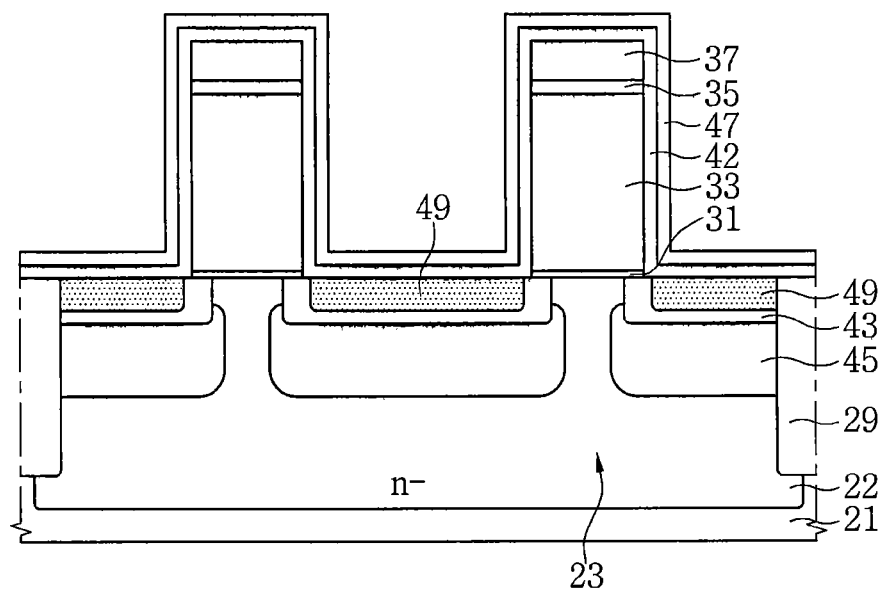

Referring to FIGS. 1 and 4A, a second spacer 47 may be formed on the first spacer 42. A faster etch rate part 49 may be formed in the active region 23 using the second spacer 47 as an ion-implantation mask (Block 510). For example, the formation of the faster etch rate part 49 may be done at a dose of 5E14 to 3E15 atoms/cm2 of $PH_3$ and an ion-implantation energy of 2 to 5 Kev. $PH_2$ may be used instead of the $PH_3$. The faster etch rate part 49 may include phosphorous (P).

The second spacer 47 may conformally cover the substrate 21. For example, the second spacer 47 may cover upper and side surfaces of the temporary gate pattern 31, 33, 35, and 37, and cover the LDD 43 and the device isolation layer 29. The second spacer 47 may include an insulating layer such as silicon oxide, silicon nitride, silicon oxy-nitride, or a combination thereof. The second spacer 47 may include a material having an etch selectivity with respect to the temporary gate electrode 33. For example, the second spacer 47 may include silicon nitride. The first spacer 42 and the second spacer 47 may sequentially cover the side surface of the temporary gate pattern 31, 33, 35, and 37.

The faster etch rate part 49 may be formed at a desired position by adjusting the thickness of the second spacer 47. The faster etch rate part 49 may be formed in the LDD 43. A bottom of the faster etch rate part 49 may be formed at a higher level than a bottom of the LDD 43. The faster etch rate part 49 may be formed to be aligned with an outer side of the temporary gate electrode 33. The active region 23 may be retained under the temporary gate electrode 33. The LDD 43 may be retained under the temporary gate electrode 33. The LDD 43 may be retained between the faster etch rate part 49 and the active region 23.

Figure 4B:
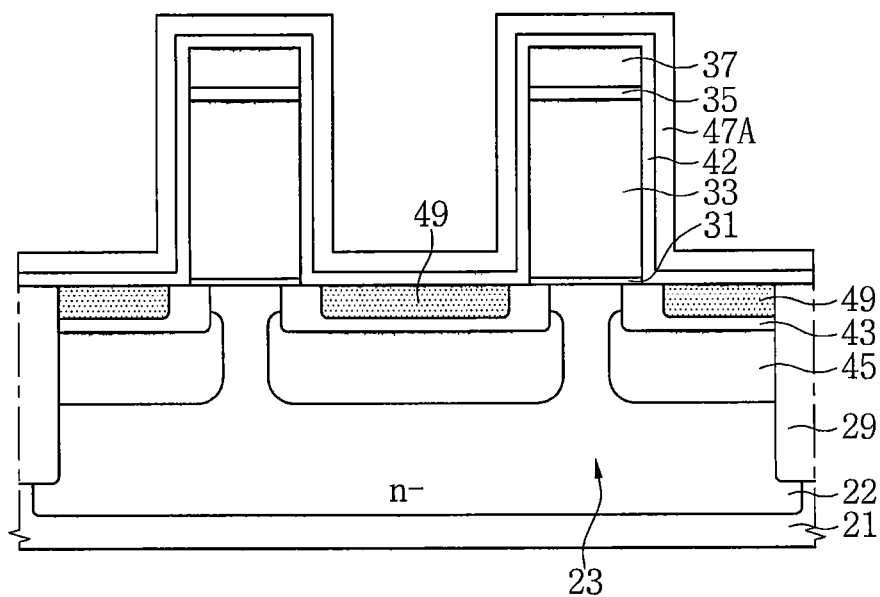

Referring to FIGS. 1 and 4B, a second spacer 47A may be formed to have various thicknesses. For example, the second spacer 47A may be formed to have a thickness of 1 to 3 nm. The second spacer 47A may function to control the location of the faster etch rate part 49. For example, a side of the faster etch rate part 49 may be controlled to be located in the LDD 43 by adjusting the thickness of the second spacer 47A. The faster etch rate part 49 may be controlled to be spaced apart from the temporary gate electrode 33 by adjusting the thickness of the second spacer 47A. The LDD 43 may be retained between the faster etch rate part 49 and the active region 23.

In some embodiments, the faster etch rate part 49 may pass through the LDD 43. For example, the bottom of the faster etch rate part 49 may be formed in the halo 45. Further, the faster etch rate part 49 may pass through both of the LDD 43 and the halo 45.

Figure 5A:
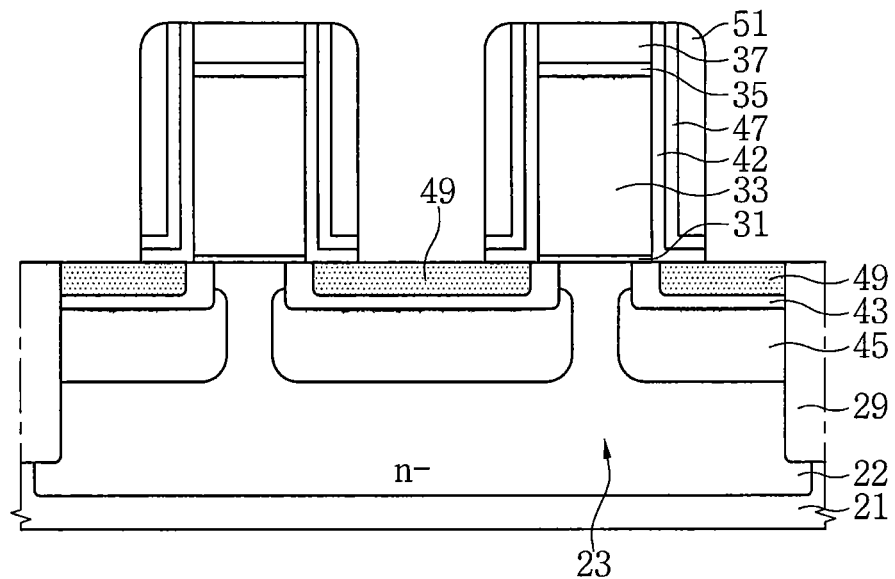

Referring to FIGS. 1 and 5A, a third spacer 51 may be formed on the second spacer 47. The formation of the third spacer 51 may include a thin-film formation process and an anisotropic etching process. During the formation of the third spacer 51, the second spacer 47 and the first spacer 42 may be partially removed to expose an upper surface of the faster etch rate part 49. The second spacer 47 and the first spacer 42 may be retained between the temporary gate pattern 31, 33, 35, and 37 and the third spacer 51.

The third spacer 51 may include an insulating material such as silicon oxide, silicon nitride, silicon oxy-nitride, or a combination thereof. The third spacer 51 may include a material having an etch selectivity with respect to the temporary gate electrode 33. For example, the third spacer 51 may include silicon nitride.

Figure 5B:
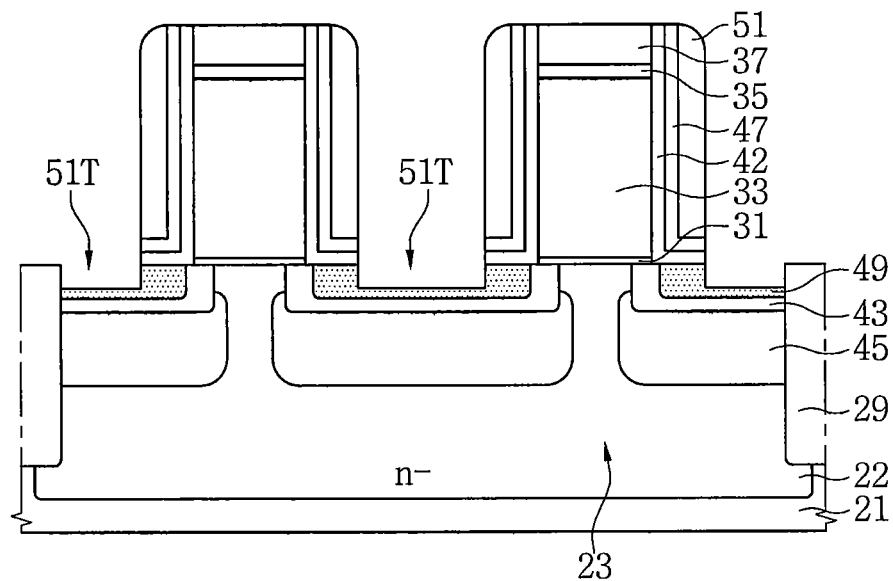

Referring to FIGS. 1 and 5B, during the formation of the third spacer 51, the faster etch rate part 49 may be partially removed to form a recess area 51T. For example, the recess area 51T may have a depth of 1 nm to 10 nm.

Figure 5C:
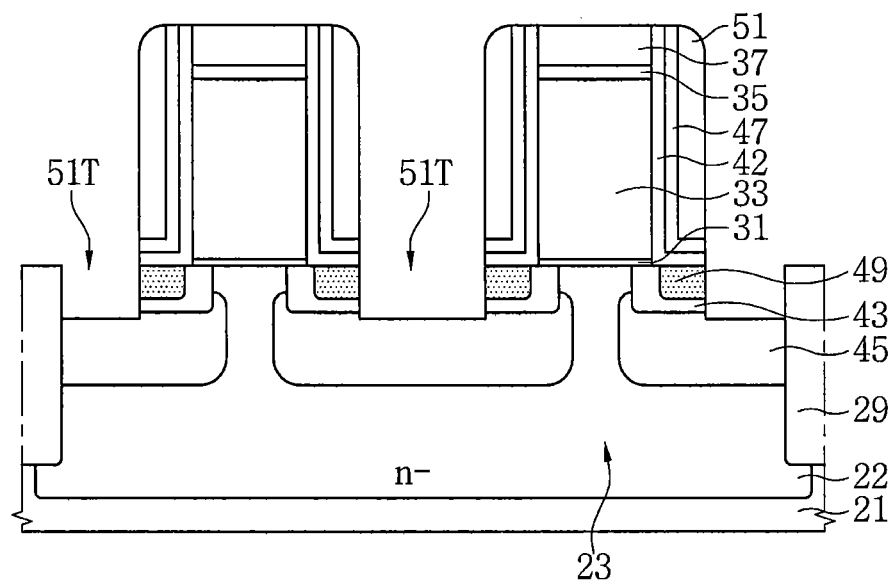

Referring to FIGS. 1 and 5C, after the formation of the third spacer 51, a recess area 51T may be formed using an additional anisotropic etching process. The recess area 51T may pass through the faster etch rate part 49 and the LDD 43. For example, the recess area 51T may have a depth of 7 nm to 10 nm. A bottom of the recess area 51T may expose the halo 45. Sidewalls of the recess area 51T may be vertically aligned with side surfaces of the third spacer 51.

Figure 6A:
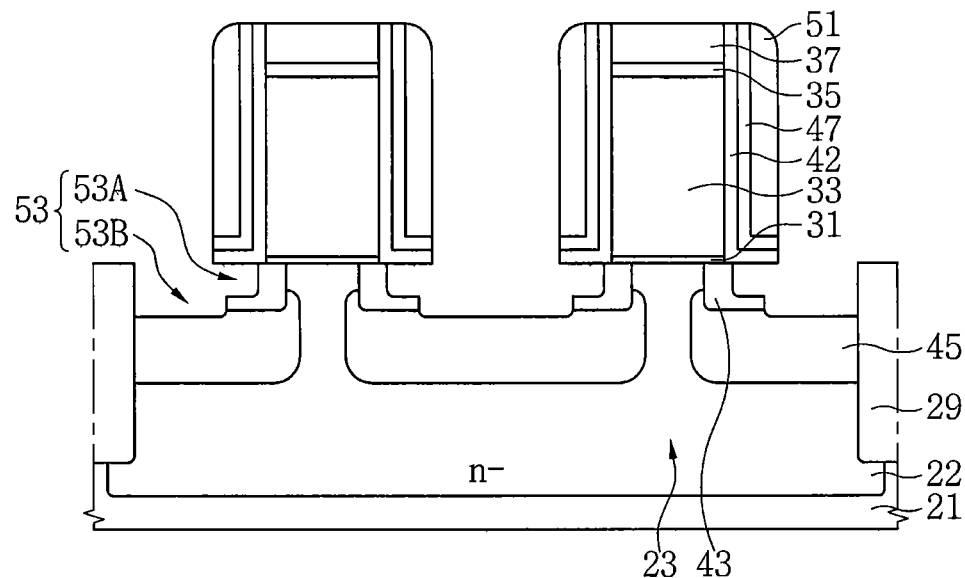
Figure 6B:
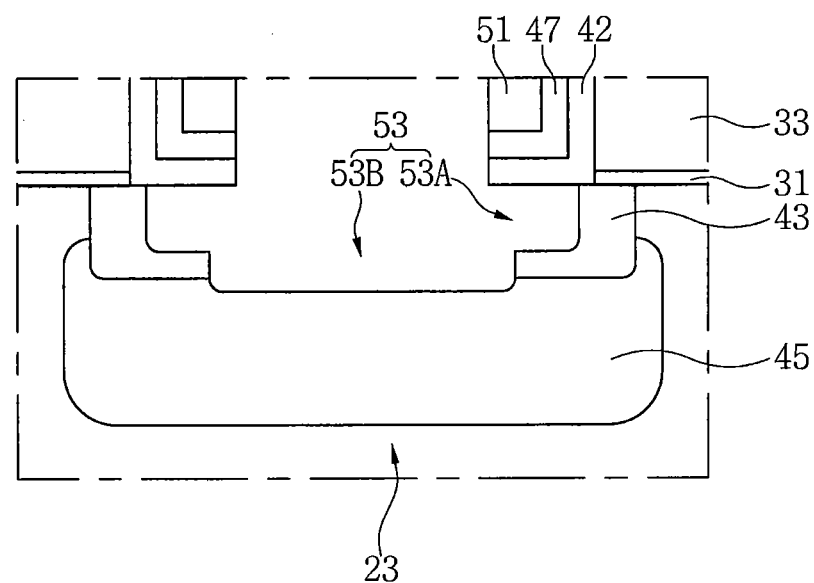

Referring to FIGS. 1, 6A, and 6B, the faster etch rate part 49, the LDD 43, and the halo 45 may be etched to form a first trench 53 (Block 520). The first trench 53 may include an upper trench 53A aligned with the faster etch rate part 49 and a lower trench 53B connected to a bottom of the upper trench 53A. The upper trench 53A may be formed in the LDD 43. Due to the upper trench 53A, an under-cut may be formed under the first spacer 42, the second spacer 47, and the third spacer 51. The lower trench 53B may pass through the LDD 43 to be formed in the halo 45. The lower trench 53B may have a width smaller than a width of the upper trench 53A. A sidewall of the first trench 53 may have a step. For example, a side surface of the LDD 43, which is exposed by the upper trench 53A and lower trench 53B, may have a step.

The formation of the first trench 53 may include a dry-etch process, a wet-etch process, or a combination thereof. The formation of the first trench 53 may include an isotropic etch process, an anisotropic etch process, or a combination thereof. For example, the formation of the first trench 53 may include an isotropic dry-etch process using HBr, $CF_4$, $O_2$, $Cl_2$, $NF_3$, or a combination thereof. According to some embodiments, single crystalline silicon containing phosphorous (P), which has an etch rate higher than that of single crystalline silicon containing boron (B), may be included in the faster etch rate part 49, and thus the faster etch rate part 49 may have an etch rate higher than that of the LDD 43. Depending on the configuration of the faster etch rate part 49 and the LDD 43, the size and shape of the upper trench 53A and lower trench 53B may be determined. The size, shape, and location of the first trench 53 may be controlled as desired, using the configuration of the faster etch rate part 49 and the LDD 43. The first trench 53 may be uniformly formed over the entire surface of the substrate 21.

Figure 6C:
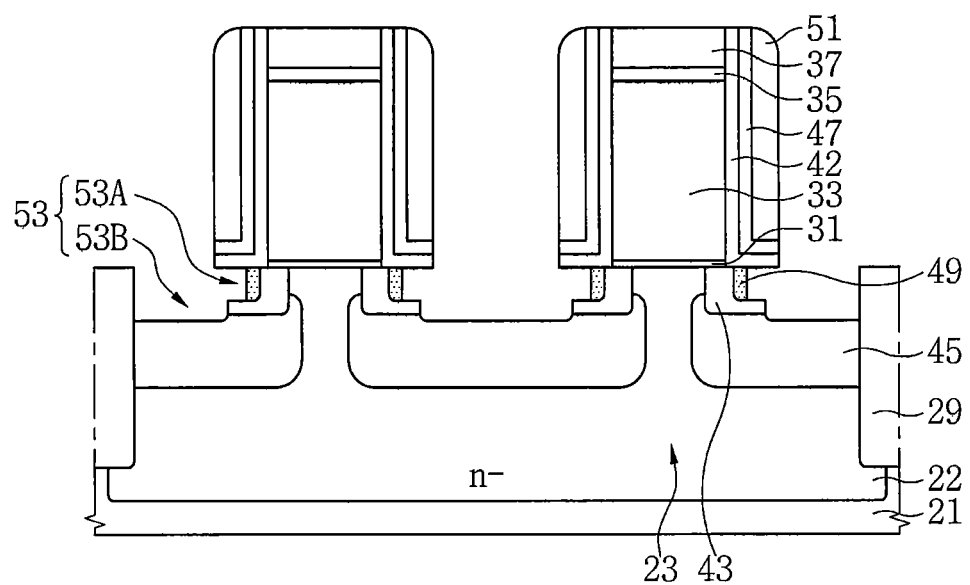

Referring to FIG. 6C, in some embodiments, the faster etch rate part 49 may be retained between the upper trench 53A and the LDD 43.

Figure 7A:
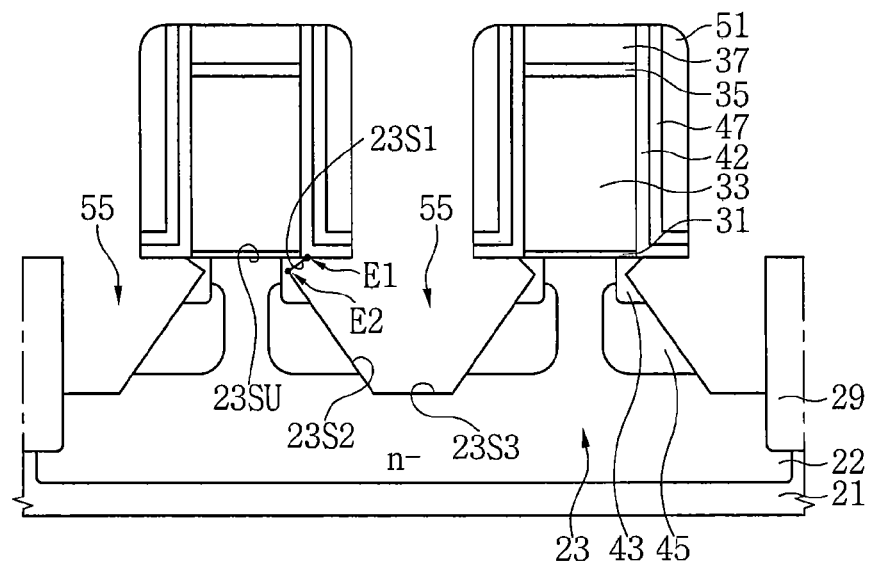

Referring to FIGS. 1 and 7A, a second trench 55 may be formed using a directional etch process (Block 530). For example, the formation of the second trench 55 may include a wet-etch process using $NH_4OH$, $NH_3OH$, TMAH (Tetra Methyl Ammonium Hydroxide), KOH, NaOH, BTMH (benzyltrimethylammonium hydroxide), or a combination thereof. The active region 23 may have a sigma shape (Σ-shape) due to the second trench 55. The LDD 43 may be retained under the temporary gate pattern 31, 33, 35, and 37. The active region 23 may include a first surface 23SU, a first side surface 23S1, a second side surface 23S2, and a second surface 23S3. A first edge E1 may be defined between the first side surface 23S1 and the first surface 23SU. A second edge E2 may be defined between the first side surface 23S1 and the second side surface 23S2. Each of the first side surface 23S1 and the second side surface 23S2 may include a {111} crystal plane. The second trench 55 may be interpreted as an extension of the first trench 53.

Figure 7B:
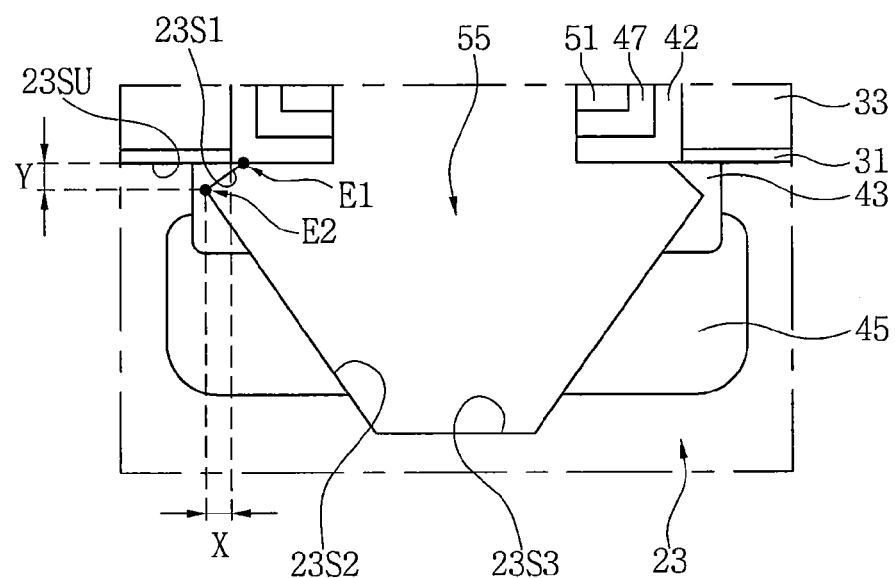

Referring to FIG. 7B, the second trench 55 may pass through the LDD 43 and the halo 45. The first surface 23SU may be defined on an upper end of the active region 23. For example, the first surface 23SU may be in contact with the buffer layer 31 and extend below the first spacer 42. The second trench 55 may expose the first side surface 23S1, the second side surface 23S2, and the second surface 23S3. The first side surface 23S1 may be connected to the first surface 23SU. The first side surface 23S1 may form an acute angle with respect to the first surface 23SU. The second side surface 23 S2 may be formed under the first side surface 23S1. The second side surface 23S2 may have a different angle from the first side surface 23S1. The second side surface 23S2 may form an acute angle with respect to a horizontal extension line, which is parallel to the substrate 21 and passes through the second surface 23S3. A bottom of the second trench 55 may expose the second surface 23S3. The second surface 23S3 may be connected to the second side surface 23S2. The first surface 23SU may be interpreted as an upper surface of the active region 23.

The first edge E1 and the second edge E2 may be formed at a desired position by controlling the location of the faster etch rate part 49. For example, the first edge E1 may be formed under the first spacer 42, and the second edge E2 may be formed to overlap a bottom of the temporary gate electrode 33. The first edge E1 and the second edge E2 may be located on a surface of the LDD 43. The first side surface 23S1 may expose the LDD 43. The second side surface 23S2 may expose the LDD 43, the halo 45, and the active region 23.

A horizontal distance X may be defined between the second edge E2 and a straight line which is perpendicular to the substrate 21 and passes through a side surface of the temporary gate electrode 33. A vertical height Y may be defined between the second edge E2 and a straight line which is parallel to the substrate 21 and passes through the first surface 23SU. For example, the horizontal distance X may be from 0 to −5 nm, and the vertical height Y may be from 3 nm to 7 nm. When the horizontal distance X is zero, it may be understood that the second edge E2 is vertically overlapped by the side surface of the temporary gate electrode 33, and when the horizontal distance X is a negative (−) value, it may be understood that the second edge E2 is vertically overlapped by the bottom of the temporary gate electrode 33. In addition, when the horizontal distance X is a positive (+) value, it may be understood that the second edge E2 may be aligned with the outer side of the temporary gate electrode 33.

The horizontal distance X and the vertical height Y may be uniformly controlled over the entire surface of the substrate 21 by adjusting the location of the faster etch rate part 49. In some embodiments, it is possible to relatively decrease the vertical height Y while increasing the absolute value of the horizontal distance X. A semiconductor device according to some embodiments of the present inventive concepts may have good electrical characteristics according to the horizontal distance X and the vertical height Y. According to some embodiments, a semiconductor device that includes the second edge E2 located on the surface of the LDD 43 may show good electrical characteristics.

Figure 7C:
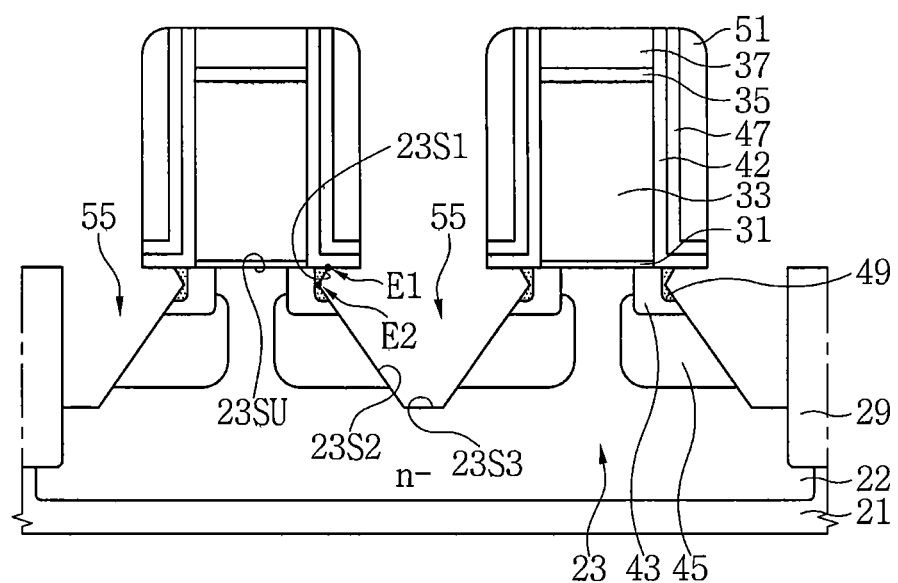

Referring to FIG. 7C, in some embodiments, the faster etch rate part 49 may be retained between the second trench 55 and the LDD 43.

Figure 8A:
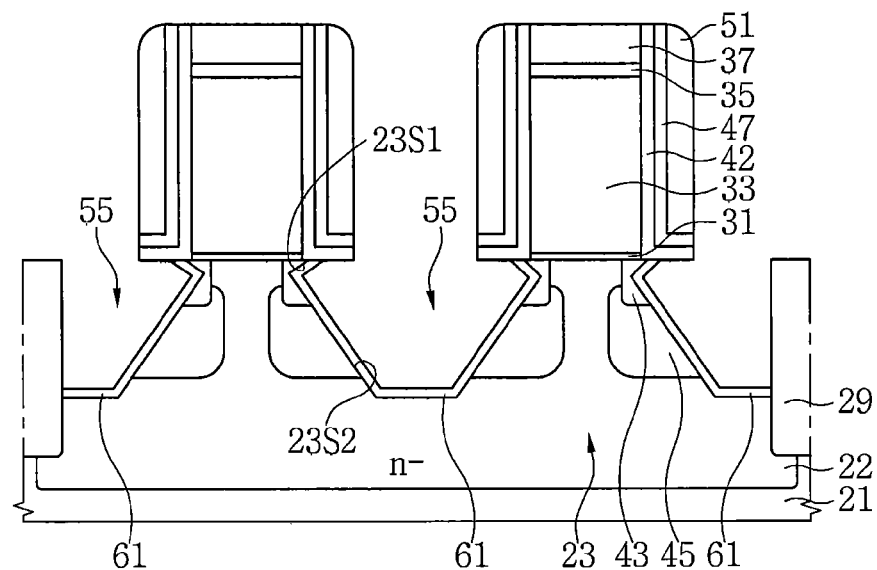

Referring to FIGS. 1 and 8A, a first semiconductor layer 61 may be formed in the second trench 55 (Block 540). The first semiconductor layer 61 may include undoped single crystalline SiGe formed by a selective epitaxial growth (SEG) method. The Ge content in the first semiconductor layer 61 may be from 10 to 25%. The first semiconductor layer 61 may conformally cover an inner wall of the second trench 55. The first semiconductor layer 61 may cover the first side surface 23S1 and the second side surface 23S2 with a constant thickness.

Figure 8B:
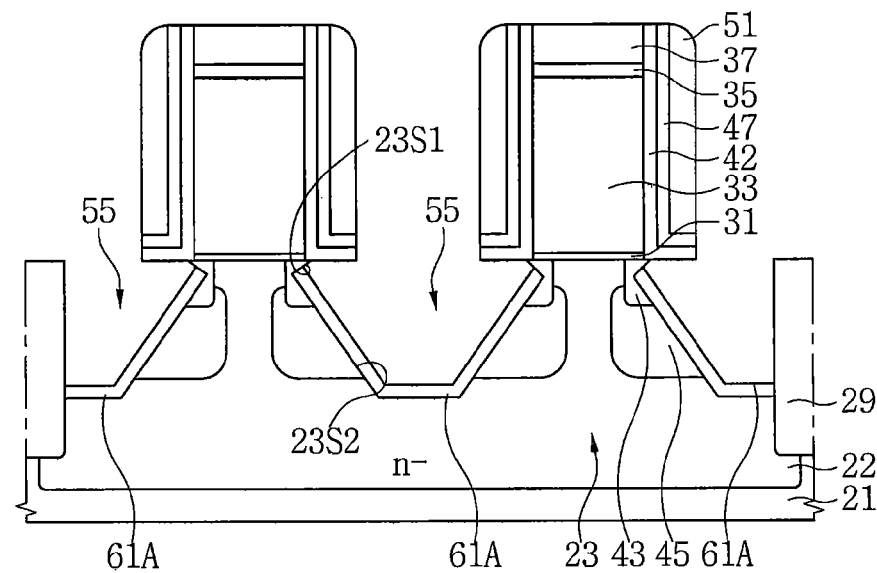

Referring to FIG. 8B, a first semiconductor layer 61A may be formed to cover the second side surface 23S2 with a constant thickness and to partially expose the first side surface 23S1.

Figure 8C:
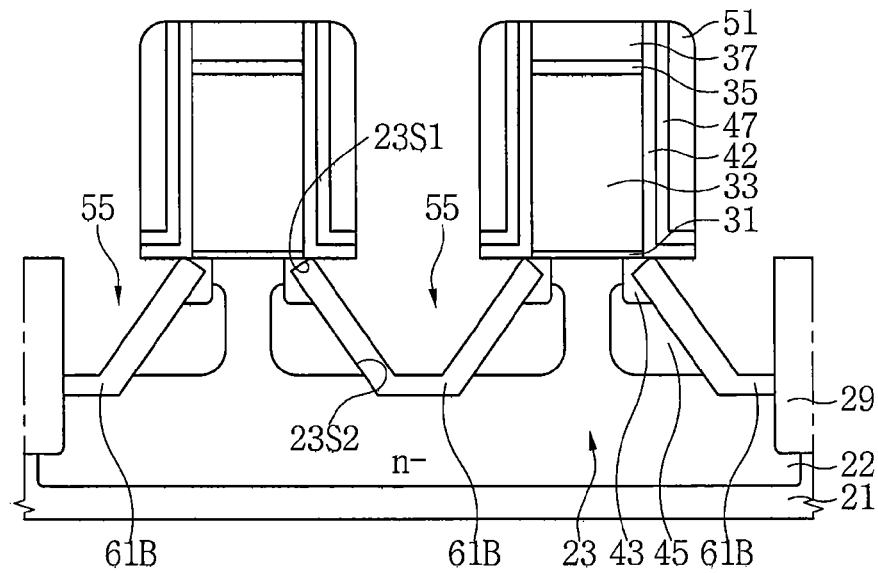

Referring to FIG. 8C, a first semiconductor layer 61B may be formed to cover the first side surface 23S1 and the second side surface 23S2.

Figure 9:
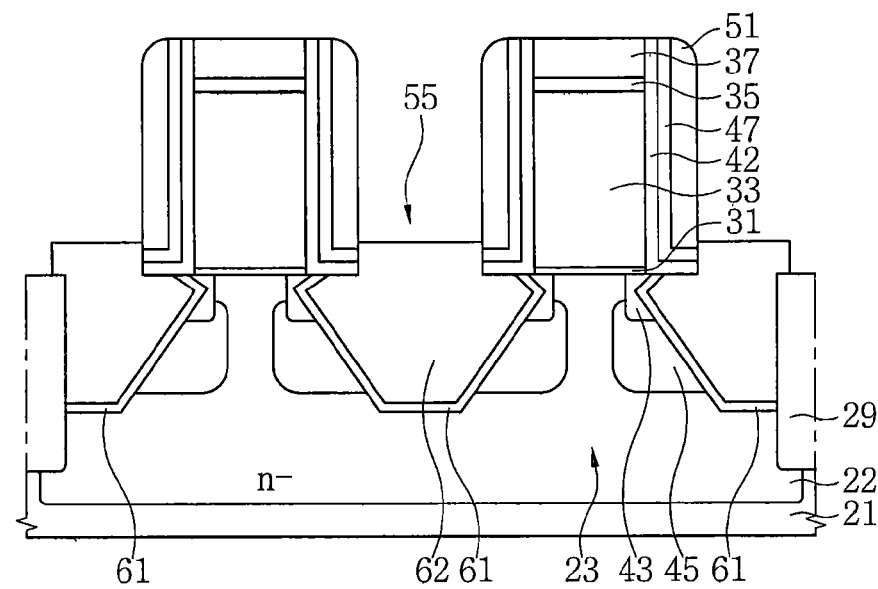

Referring to FIGS. 1 and 9, a second semiconductor layer 62 may be formed in the second trench 55 (Block 550). The second semiconductor layer 62 may include B-doped single crystalline SiGe by an SEG method. The Ge content in the second semiconductor layer 62 may be from 25 to 50%. The second semiconductor layer 62 may contain 1E20 to 3E20 atoms/cm3 of B. The second semiconductor layer 62 may fully fill the second trench 55. An upper end of the second semiconductor layer 62 may be at higher level than the active region 23.

Figure 10:
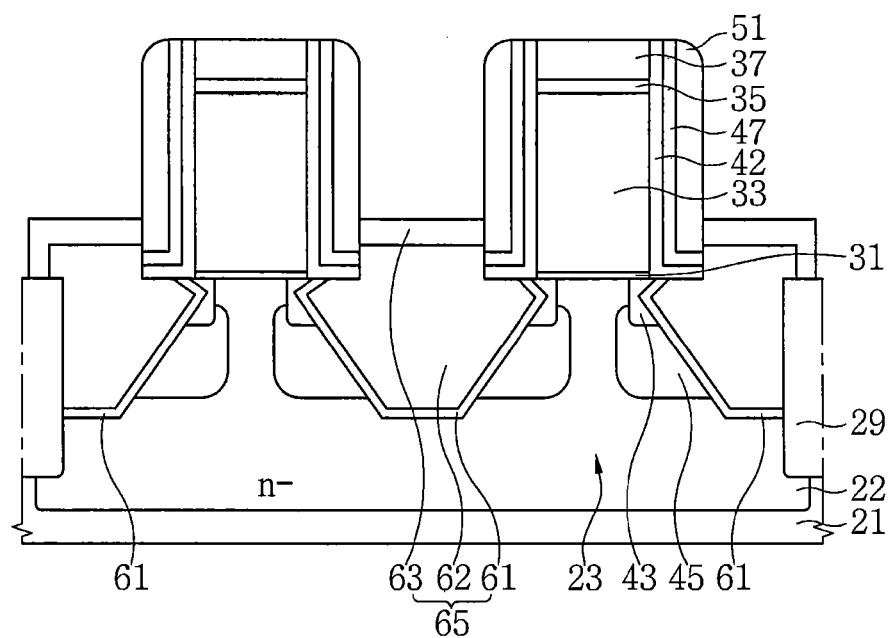

Referring to FIGS. 1 and 10, a third semiconductor layer 63 may be formed on the second semiconductor layer 62 (Block 560). The third semiconductor layer 63 may include B-doped single crystalline silicon by the SEG method. The third semiconductor layer 63 may contain 1E20 to 3E20 atoms/cm3 of B. The first semiconductor layer 61, the second semiconductor layer 62, and the third semiconductor layer 63 may form an embedded stressor 65. The embedded stressor 65 may be referred to as a strain-inducing pattern. In some embodiments, the first semiconductor layer 61 or the third semiconductor layer 63 may be omitted.

Figure 11:
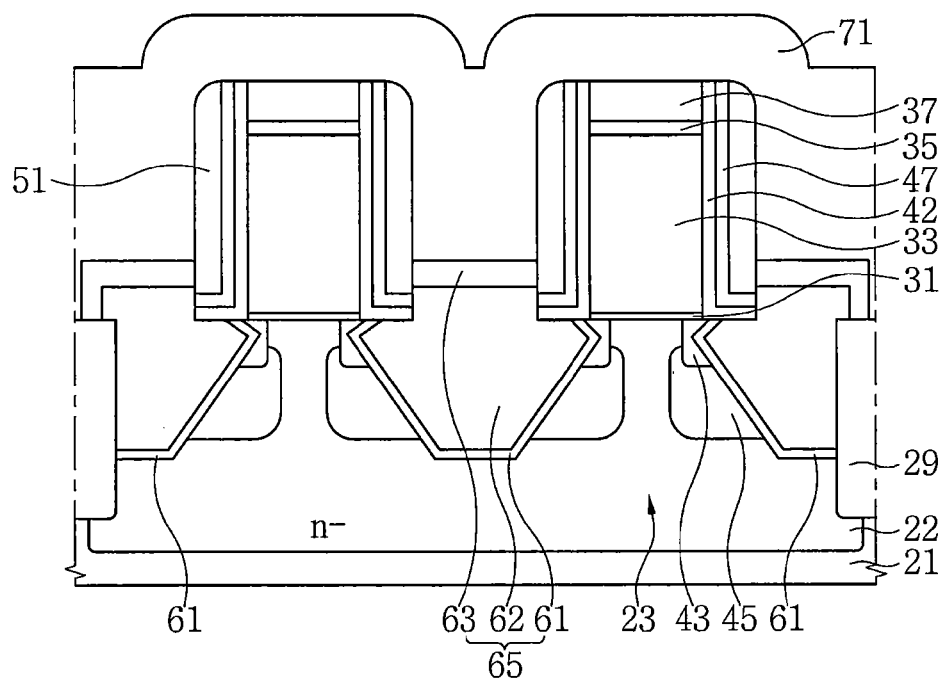

Referring to FIGS. 1 and 11, an interlayer insulating layer 71 may be formed on the substrate 21 (Block 570). The interlayer insulating layer 71 may include an insulating layer such as silicon oxide, silicon nitride, silicon oxy-nitride, or a combination thereof. In some embodiments, several additional processes, such as a metal silicide formation process and a heat treatment process, may be performed on the third semiconductor layer 63 before the formation of the interlayer insulating layer 71.

Figure 12:
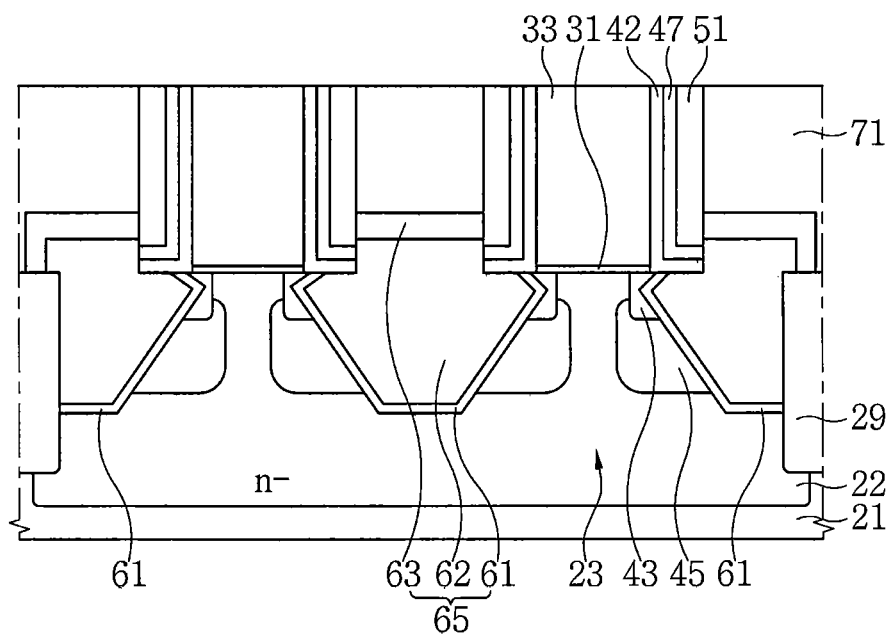

Referring to FIGS. 1 and 12, the temporary gate electrode 33 may be exposed by partially removing the interlayer insulating layer 71 and removing the second mask pattern 37 and the first mask pattern 35. The removal of the interlayer insulating layer 71, the second mask pattern 37, and the first mask pattern 35 may be performed by a chemical mechanical polishing (CMP) process, an etch-back process, or a combination thereof.

Figure 13:
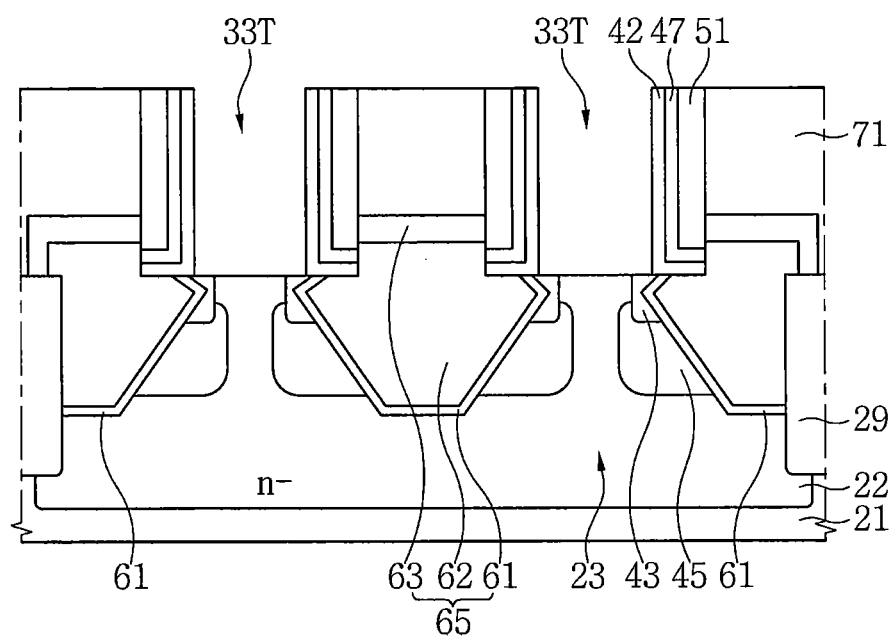

Referring to FIGS. 1 and 13, a gate trench 33T exposing the active region 23 may be formed by removing the temporary gate electrode 33 and the buffer layer 31.

Figure 14A:
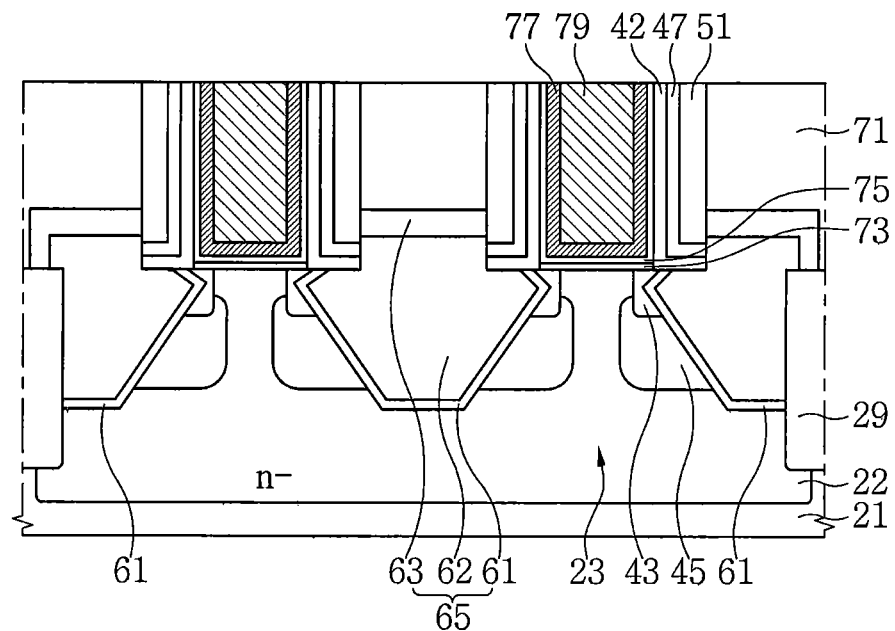

Referring to FIGS. 1 and 14A, a first gate dielectric layer 73, a second gate dielectric layer 75, a first gate electrode 77, and a second gate electrode 79 may be formed in the gate trench 33T.

The first gate dielectric layer 73 may be formed on the active region 23. The first gate dielectric layer 73 may be referred to as an interfacial oxide layer. The first gate dielectric layer 73 may be formed by a cleaning process. The first gate dielectric layer 73 may include silicon oxide. The second gate dielectric layer 75 may include silicon oxide, silicon nitride, silicon oxy-nitride, a high-K dielectric material, or a combination thereof. For example, the second gate dielectric layer 75 may include HfO or HfSiO. The second gate dielectric layer 75 may surround a side and a bottom of the first gate electrode 77. The first gate dielectric layer 73 may be interposed between the active region 23 and the second gate dielectric layer 75.

The first gate electrode 77 may surround a side and a bottom of the second gate electrode 79. The first gate electrode 77 may include a conductive material chosen by considering a work-function. For example, the first gate electrode 77 may include TiN or TaN. The second gate electrode 79 may include a metal layer. In some embodiments, the first gate electrode 77 may include TiAl or TiAlC.

Figure 14B:
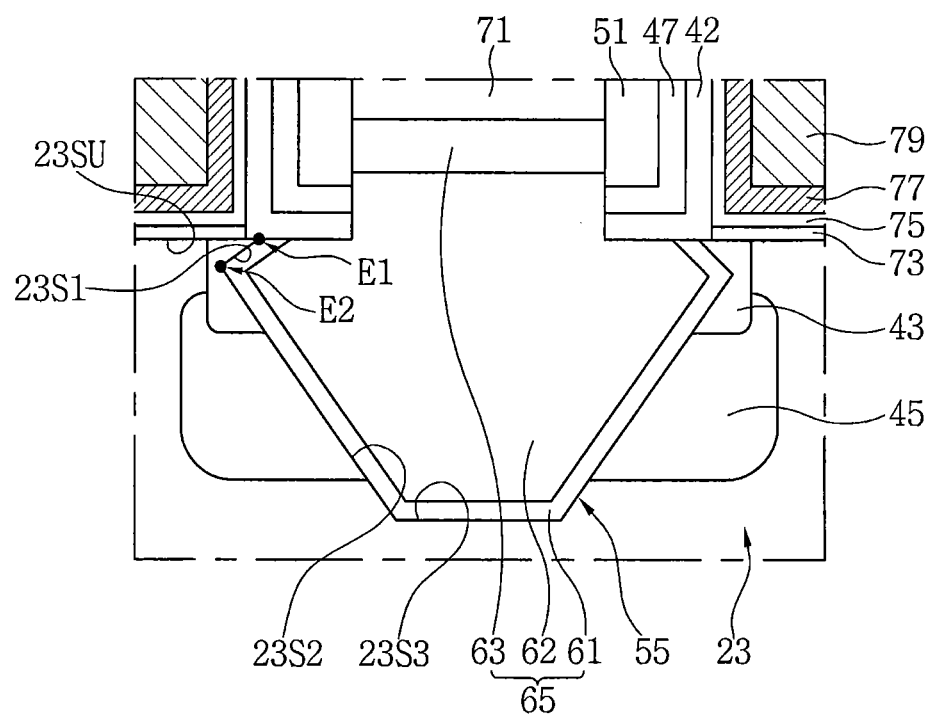

Referring to FIG. 14B, the embedded stressor 65 may pass through the LDD 43 and the halo 45 to be in contact with the active region 23. A bottom of the embedded stressor 65 may be formed at a lower level than the halo 45. The embedded stressor 65 may be in contact with the first side surface 23S1 and the second side surface 23 S2. The first semiconductor layer 61 may be interposed between the LDD 43 and the second semiconductor layer 62.

The concentration of the first conductivity-type impurities in the second semiconductor layer 62 may be higher than that in the LDD 43. For example, a boron (B) concentration in the second semiconductor layer 62 may be higher than that in the LDD 43. The first conductivity-type impurities in the second semiconductor layer 62 may diffuse into the first semiconductor layer 61. The boron (B) concentration in the first semiconductor layer 61 may be lower than that in second semiconductor layer 62.

Phosphorous (P) implanted in the faster etch rate part 49 (e.g., as illustrated in FIG. 4A) may diffuse into the LDD 43. The LDD 43 may contain phosphorous and boron. For example, the LDD 43 may contain 5E18 to 1E19 atoms/cm3 of phosphorous. While implanting phosphorous to the faster etch rate part 49, the phosphorous may remain in the second spacer 47, the first spacer 42 and an interface thereof. The phosphorous may remain in the third spacer 51 and an interface between the third spacer 51 and the second spacer 47. The phosphorous may remain in the embedded stressor 65 and interfaces between the embedded stressor 65 and the first, second and third spacers 42, 47, 51. In some embodiments, the phosphorous may also remain in the LDD 43 and between interfaces of the LDD 43 and the first, second and third spacers 42, 47, 51.

Figure 14C:
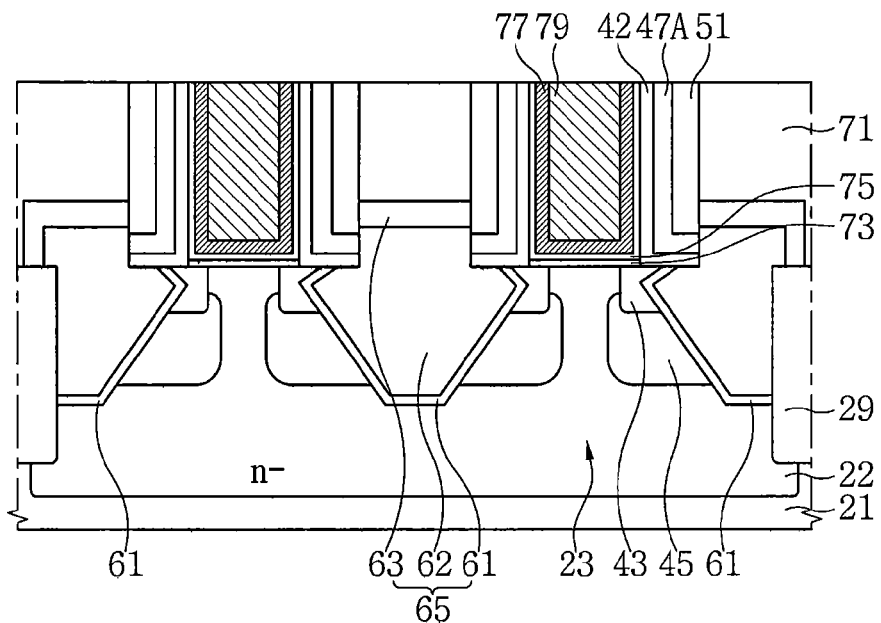

Referring to FIG. 14C, the embedded stressor 65 may be formed to have a desired horizontal width by adjusting the thickness of the second spacer 47A. For example, the embedded stressor 65 may be formed at an outer side of the first gate electrode 77.

Figure 14D:
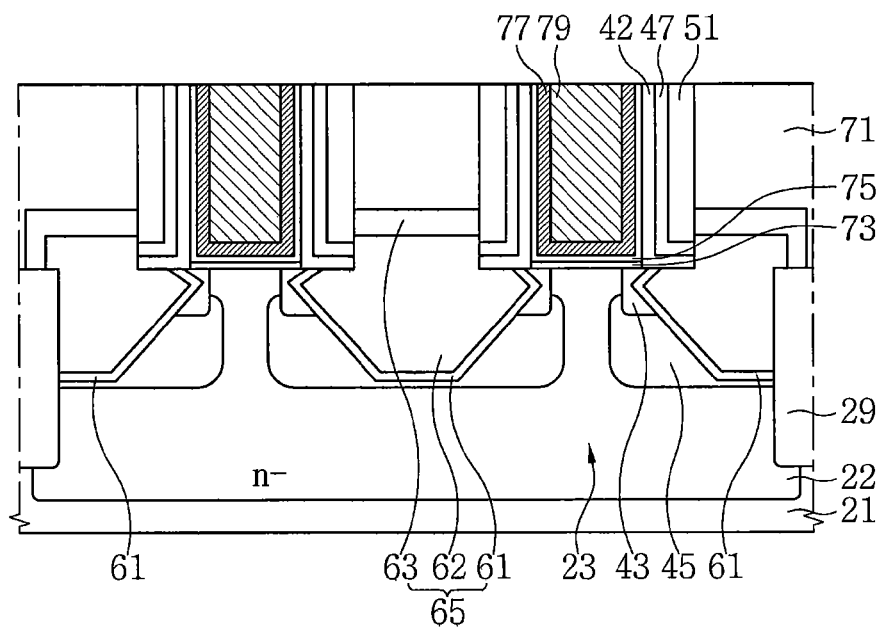

Referring to FIG. 14D, the bottom of the embedded stressor 65 may be located in the halo 45.

Figure 14E:
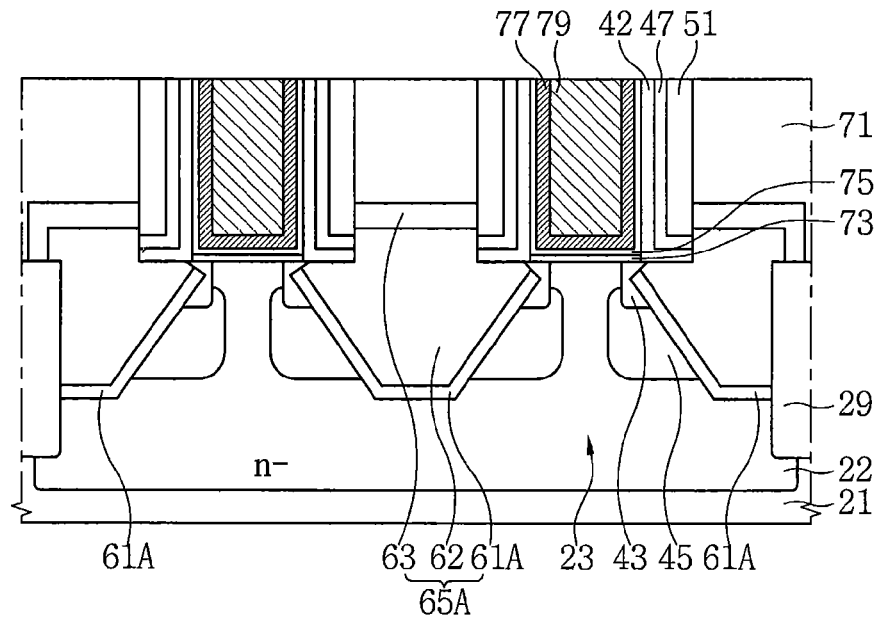

Referring to FIG. 14E, an embedded stressor 65A may include a first semiconductor layer 61A, the second semiconductor layer 62, and the third semiconductor layer 63. The first semiconductor layer 61A may be formed to cover the second side surface 23 S2 with a constant thickness and to partially expose the first side surface 23S1. The second semiconductor layer 62 may be in contact with the first side surface 23S1.

Figure 14F:
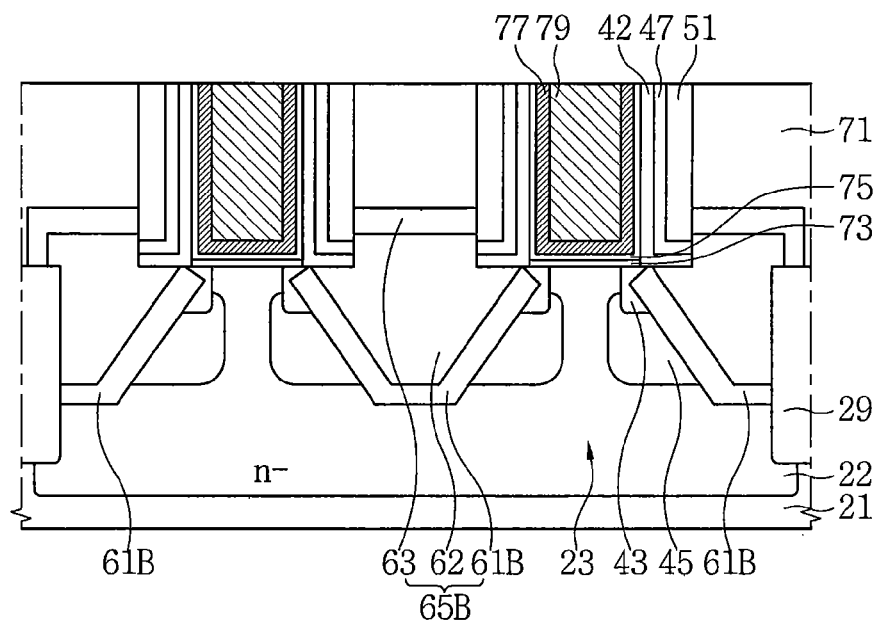

Referring to FIG. 14F, an embedded stressor 65B may include a first semiconductor layer 61B, the second semiconductor layer 62, and the third semiconductor layer 63. The first semiconductor layer 61B may be formed to cover the first side surface 23S1 and the second side surface 23S2. The first semiconductor layer 61B may be formed between the LDD 43 and the second semiconductor layer 62.

Figure 14G:
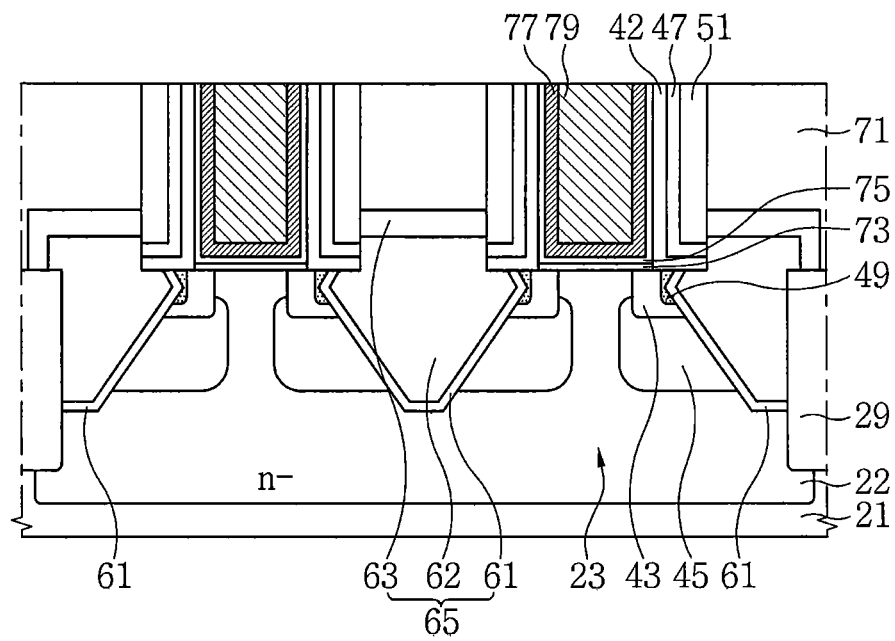

Referring to FIG. 14G, the faster etch rate part 49 may be retained between the embedded stressor 65 and the LDD 43.

Figure 15:
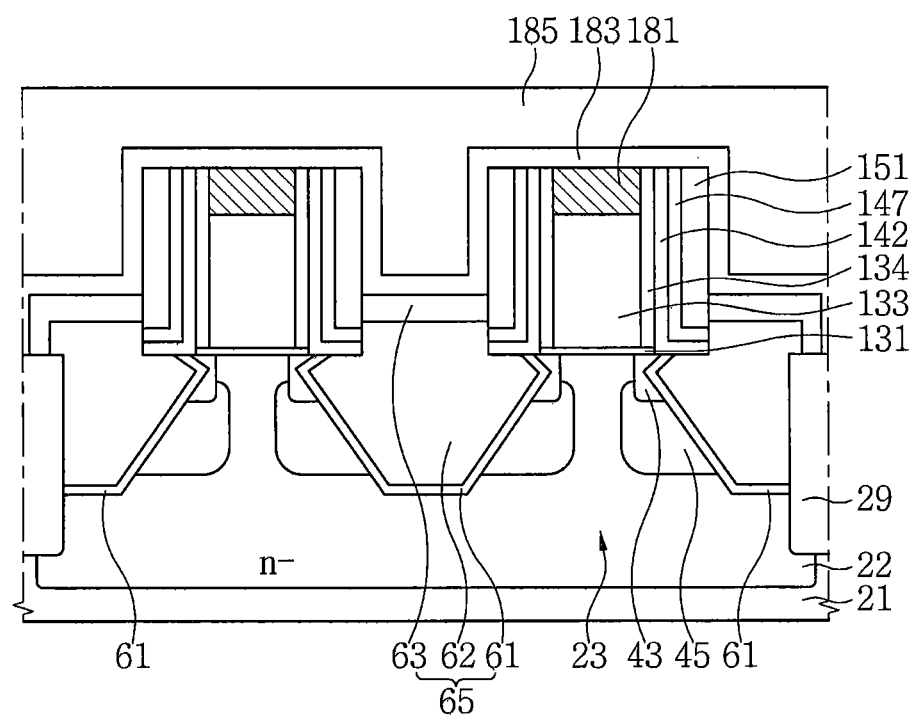
FIG. 15 is a cross-sectional view illustrating an intermediate structure provided in operations of forming a semiconductor device according to some embodiments of the present inventive concepts.

FIG. 15 is a cross-sectional view illustrating an intermediate structure provided in operations of forming a semiconductor device according to some embodiments of the present inventive concepts. Referring to FIG. 15, a well 22, an active region 23, a device isolation layer 29, a gate dielectric layer 131, a first gate electrode 133, a second gate electrode 181, an inner spacer 134, a first spacer 142, a lightly doped drain (LDD) 43, a halo 45, a second spacer 147, a third spacer 151, an embedded stressor 65, an etch stopping layer 183, and an interlayer insulating layer 185 may be formed on the substrate 21. The gate dielectric layer 131 and the first gate electrode 133 may be formed before forming the embedded stressor 65.

The gate dielectric layer 131 may include silicon oxide, silicon nitride, silicon oxy-nitride, a high-K dielectric layer, or a combination thereof. The first gate electrode 133 may include a conductive layer such as polysilicon, a metal silicide, a metal, or a combination thereof. The second gate electrode 181 may include a conductive layer such as a metal silicide, a metal, or a combination thereof. The inner spacer 134 may include silicon oxide, silicon nitride, silicon oxy-nitride, or a combination thereof. The etch stopping layer 183 may include a material having an etch selectivity with respect to the interlayer insulating layer 185. For example, the interlayer insulating layer 185 may include silicon oxide, and the etch stopping layer 183 may include silicon nitride.

Figure 16:
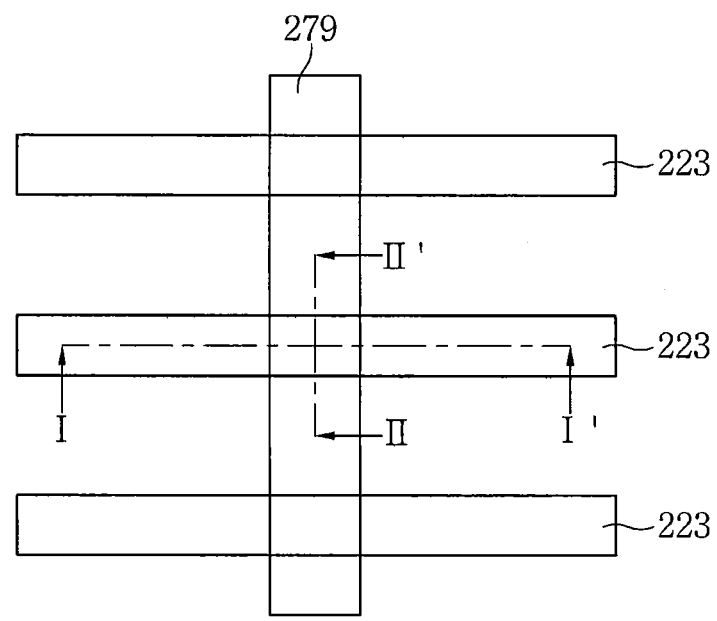
FIG. 16 is a layout of a semiconductor device according to some embodiments of the present inventive concepts.

FIG. 16 is a layout of a semiconductor device according to some embodiments of the present inventive concepts. FIGS. 17-24, 25A-25C, 26-30, and 31A-31C are cross-sectional views taken along lines I-I' and II-II' of FIG. 16 illustrating intermediate structures provided in operations of forming a semiconductor device according to some embodiments of the present inventive concepts.

Figure 17:
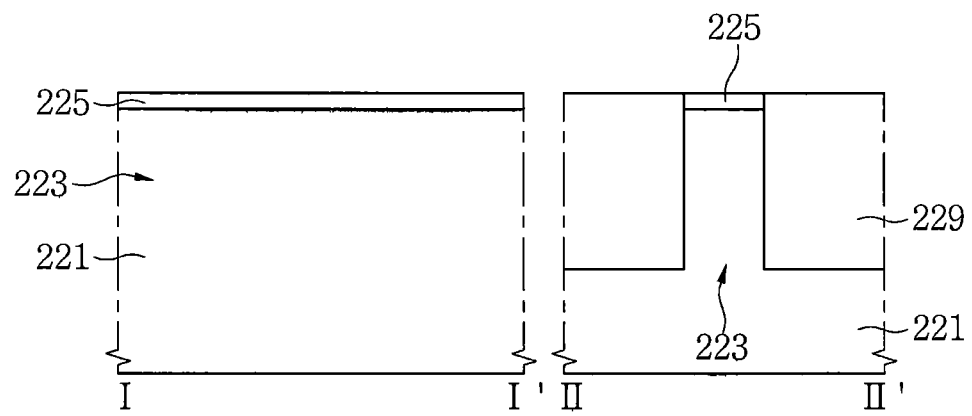
FIGS. 17-24, 25A-25C, 26-30, and 31A-31C are cross-sectional views taken along lines I-I' and II-II' of FIG. 16 illustrating intermediate structures provided in operations of forming a semiconductor device according to some embodiments of the present inventive concepts.

Referring to FIGS. 16 and 17, a device isolation layer 229 defining an active region 223 may be formed on a substrate 221. An upper surface of the active region 223 may be covered by a buffer layer 225. The active region 223 may have various shapes such as a fin-shape or wire-shape. For example, the active region 223 may include a fin-shaped single crystalline silicon in which the major axis is formed to be relatively long.

Figure 18:
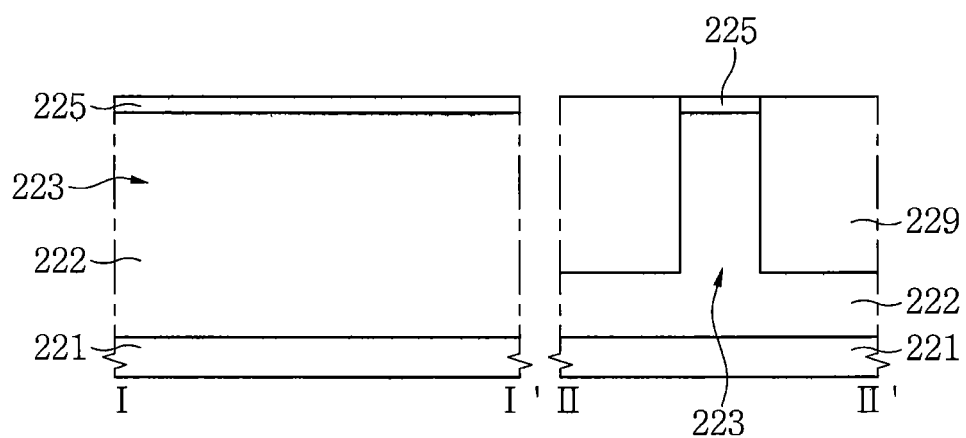

Referring to FIGS. 16 and 18, a well 222 may be formed in a predetermined region of the substrate 221. The active region 223 may be confined to the well 222. Channel ions may be implanted in the active region 223. The well 222 may be formed by implanting impurities having a conductivity type different from that of impurities in the substrate 221. For example, the well 222 may be formed by implanting n-type impurities to a predetermined depth from the surface of the substrate 221. In some embodiments, the well 222 may be formed before the formation of the device isolation layer 229. In some embodiments, the well 222 may be omitted.

Figure 19:
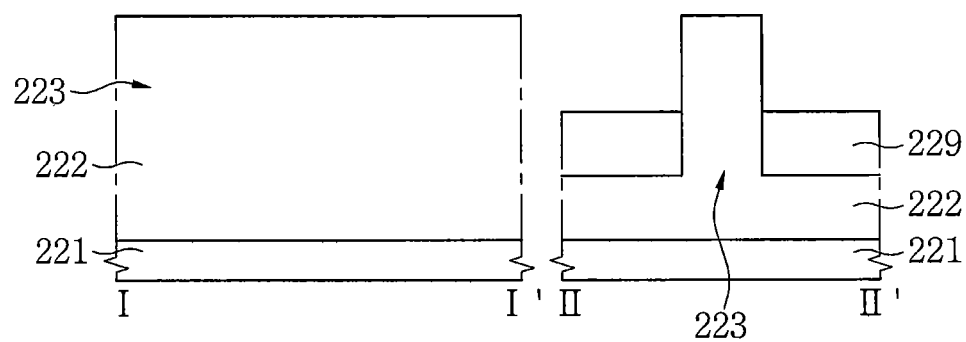

Referring to FIGS. 16 and 19, side surfaces of the active region 223 may be exposed by recessing the device isolation layer 229. The device isolation layer 229 may be retained at a lower level than an upper end of the active region 223. While recessing the device isolation layer 229, the buffer layer 225 may also be removed. The upper surface of the active region 223 may be exposed. An etch-back process may be performed in the recess of the device isolation layer 229.

Figure 20:
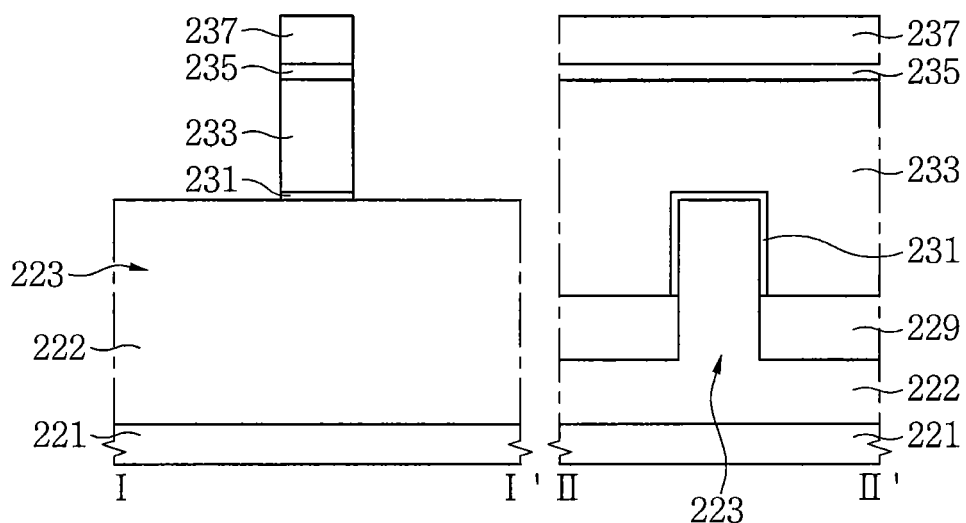

Referring to FIGS. 16 and 20, a temporary gate dielectric layer 231, a temporary gate electrode 233, a first mask pattern 235, and a second mask pattern 237 may be formed on the active region 223. The temporary gate electrode 233 may be formed by a thin film formation process, a CMP process, and a patterning process.

The temporary gate electrode 233 may cross the active region 223. The temporary gate electrode 233 may cover side and upper surfaces of the active region 223. The temporary gate dielectric layer 231 may be formed between the active region 223 and the temporary gate electrode 233. The temporary gate dielectric layer 231 may include an insulating material such as silicon oxide, silicon nitride, silicon oxy-nitride, or a combination thereof. The temporary gate electrode 233 may include polysilicon. The first mask pattern 235 may include silicon oxide. The second mask pattern 237 may include silicon nitride.

Figure 21:
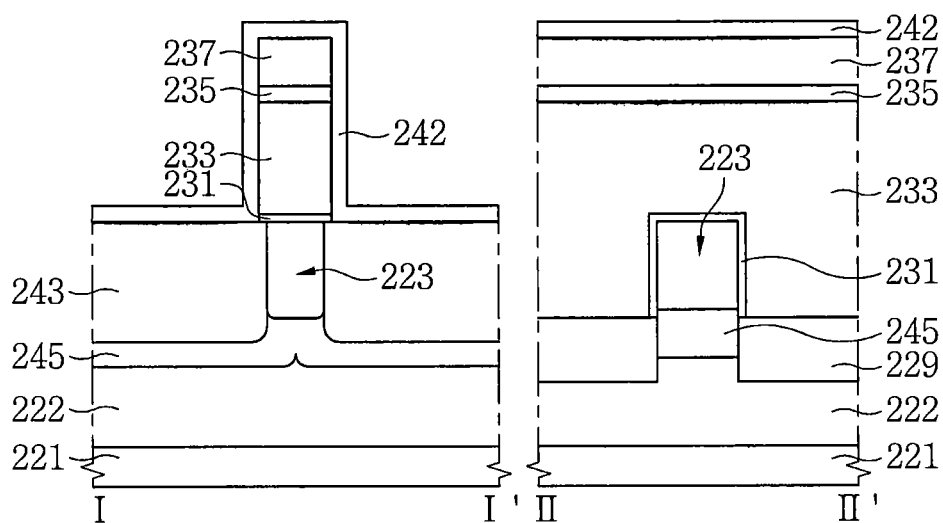

Referring to FIGS. 16 and 21, a first spacer 242 may be formed on side surfaces of the temporary gate electrode 233. A lightly doped drain (LDD) 243 and a halo 245 may be formed in the active region 223. The first spacer 242 may cover side surfaces of the temporary gate electrode 233, the first mask pattern 235, and the second mask pattern 237. The first spacer 242 may include an insulating layer such as silicon oxide, silicon nitride, silicon oxy-nitride, or a combination thereof. For example, the first spacer 242 may be silicon nitride.

The LDD 243 and the halo 245 may be formed using the second mask pattern 237 and the first spacer 242 as an ion-implantation mask. The LDD 243 may be formed in the active region 223 adjacent to an outer side of the temporary gate electrode 233. The LDD 243 may diffuse under the first spacer 242. The LDD 243 may include impurities having a conductivity type different from that of impurities in the well 222. For example, the LDD 243 may include p-type impurities. The LDD 243 may include boron.

The halo 245 may be formed outside of the LDD 243. The halo 245 may cover a bottom and side surfaces of the LDD 243. The halo 245 may include impurities having a conductivity type different from that of impurities in the LDD 243, and the halo 245 may include impurities having a conductivity type that is same as that of impurities in the well 222. For example, the halo 245 may include n-type impurities. The concentration of the n-type impurities of the halo 245 may be higher than that of the well 222.

Figure 22:
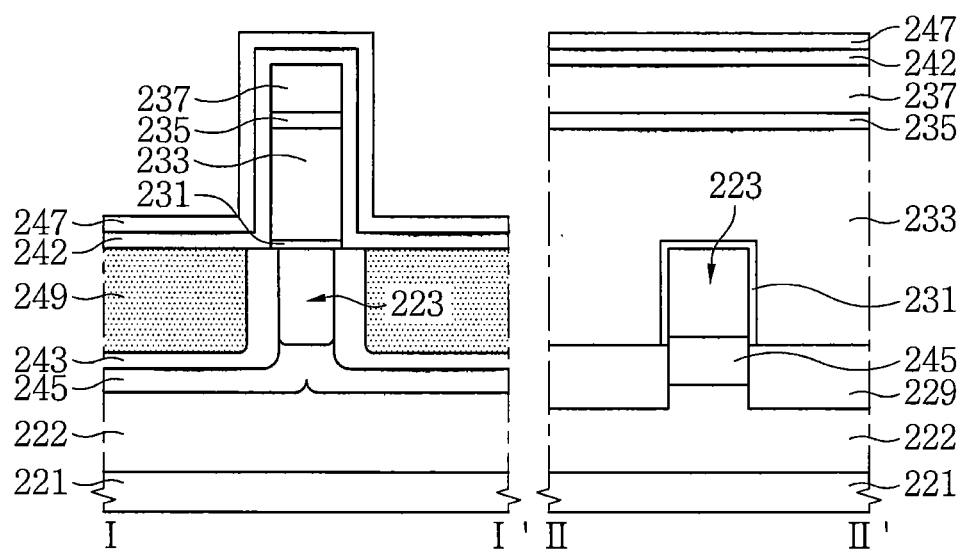

Referring to FIGS. 16 and 22, a second spacer 247 may be formed on the first spacer 242. A faster etch rate part 249 may be formed in the active region 223 using the second spacer 247 as an ion-implantation mask. The faster etch rate part 249 may include phosphorous. The second spacer 247 may conformally cover the substrate 221. The second spacer 247 may include a material having an etch selectivity with respect to the temporary gate electrode 233. For example, the second spacer 247 may include silicon nitride.

The faster etch rate part 249 may be formed at a desired position by adjusting the thickness of the second spacer 247. The faster etch rate part 249 may be formed in the LDD 243. A bottom of the faster etch rate part 249 may be formed at a higher level than that of the LDD 243. The faster etch rate part 249 may be formed to be aligned with an outer side of the temporary gate electrode 233. The active region 223 may be retained under the temporary gate electrode 233. The LDD 243 may be retained under the temporary gate electrode 233. The LDD 243 may be retained between the faster etch rate part 249 and the active region 223.

Figure 23:
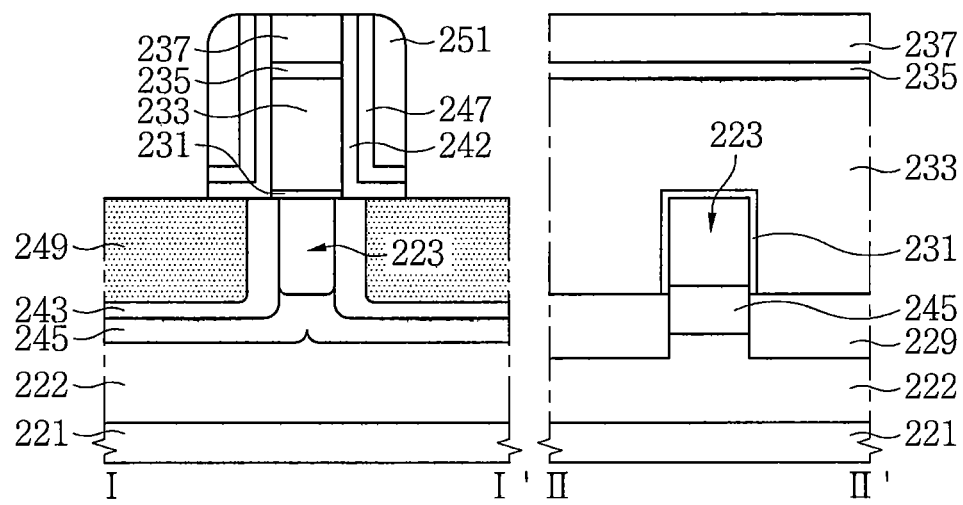

Referring to FIGS. 16 and 23, a third spacer 251 may be formed on the second spacer 247. The formation of the third spacer 251 may include a thin-film formation process and an anisotropic etching process. While forming the third spacer 251, the second spacer 247 and the first spacer 242 may be partially removed to expose an upper surface of the faster etch rate part 249. The second spacer 247 and the first spacer 242 may be retained between the temporary gate electrode 233 and the third spacer 251.

Figure 24:
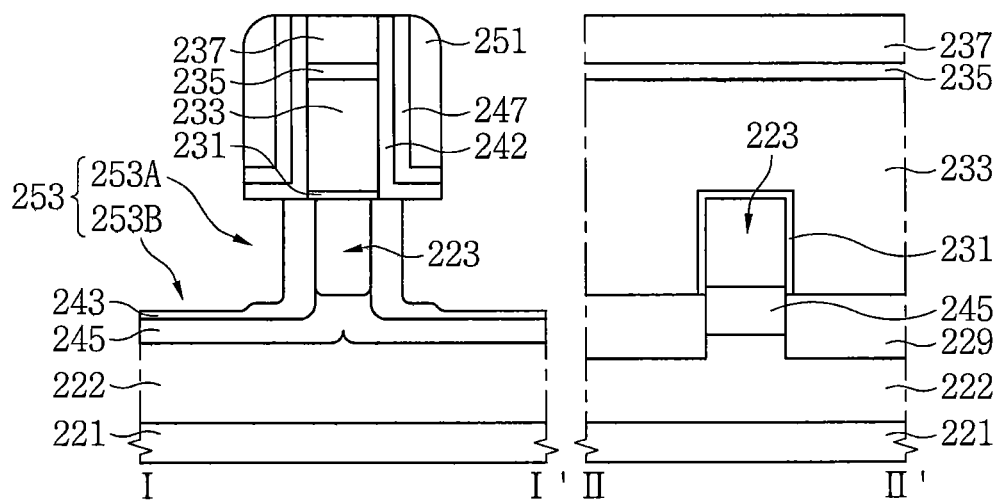

Referring to FIGS. 16 and 24, a first trench 253 may be formed by etching the faster etch rate part 249 and the LDD 243. The first trench 253 may include an upper trench 253A aligned with the faster etch rate part 249 and a lower trench 253B connected to a bottom of the upper trench 253A. The upper trench 253A may be formed in the LDD 243. An under-cut may be formed under the first spacer 242, the second spacer 247, and the third spacer 251 by the upper trench 253A. A sidewall of the first trench 253 may have a step. For example, the side surface of the LDD 243, which is exposed by the upper trench 253A and lower trench 253B, may have the step.

The formation of the first tre4nch 253 may include a dry-etch process, a wet-etch process, or a combination thereof. The formation of the first trench 253 may include an isotropic etching process, an anisotropic etching process, or a combination thereof. For example, the formation of the first trench 253 may include an isotropic dry-etch process using HBr, $CF_4$, $O_2$, $Cl_2$, $NF_3$, or a combination thereof. According to some embodiments, single crystalline silicon including phosphorous, which has an etch rate higher than that of single crystalline silicon including boron, may be included in the faster etch rate part 249, and thus the faster etch rate part 249 may have an etch rate higher than that of the LDD 243. Sizes and shapes of the upper trench 253A and lower trench 253B may be determined depending on the configuration of the faster etch rate part 249 and the LDD 243.

Figure 25A:
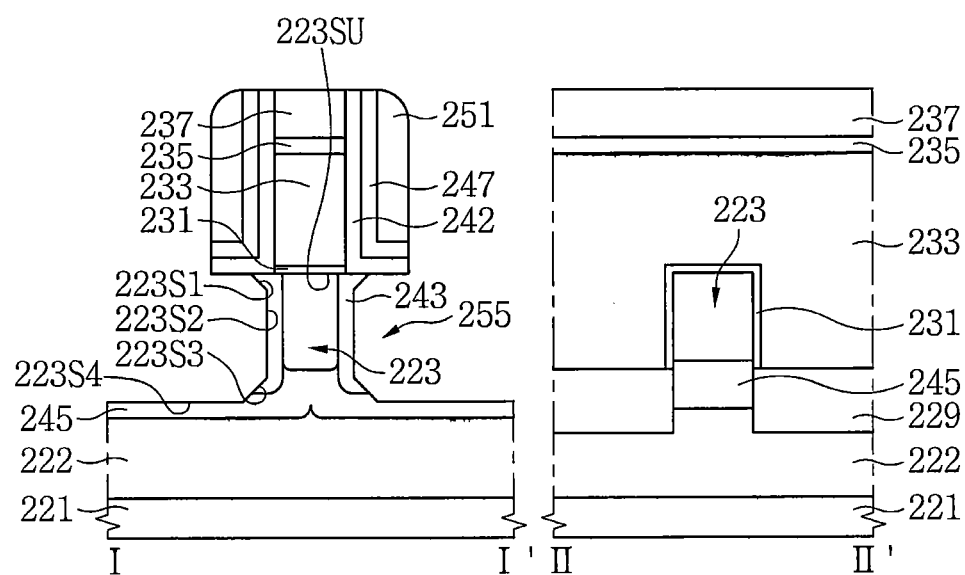

Referring to FIGS. 16 and 25A, a second trench 255 may be formed using a directional etch process. For example, the formation of the second trench 255 may include a wet-etch process using $NH_4OH$, $NH_3OH$, TMAH (Tetra Methyl Ammonium Hydroxide), KOH, NaOH, BTMH (benzyltrimethylammonium hydroxide), or a combination thereof. The directional etch process may have different etch rates depending on crystal orientations of the active region 223. The second trench 255 may pass through the LDD 243. The LDD 243 may be retained between the second trench 255 and the active region 223.

The active region 223 may include a first surface 223SU, a first side surface 223S1, a second side surface 223S2, a third side surface 223S3, and a second surface 223S4. Each of the first side surface 223S1, the second side surface 223S2, and the third side surface 223S3 may include a {111} crystal plane. The first surface 223SU may be formed on the upper end of the active region 223. The first side surface 223S1 may be connected to the first surface 223SU. The first side surface 223S1 may form an acute angle with respect to the first surface 223SU. The second side surface 223S2 may be formed under the first side surface 223S1. The second side surface 223S2 may have a slope different from that of the first side surface 223S1. The second side surface 223S2 may be perpendicular to the substrate 221. The third side surface 223S3 may be formed under the second side surface 223S2. The third side surface 223S3 may have a slope different from that of the second side surface 223S2. A bottom of the second trench 255 may expose the second surface 223S4. The second surface 223S4 may be connected to the third side surface 223S3.

Figure 25B:
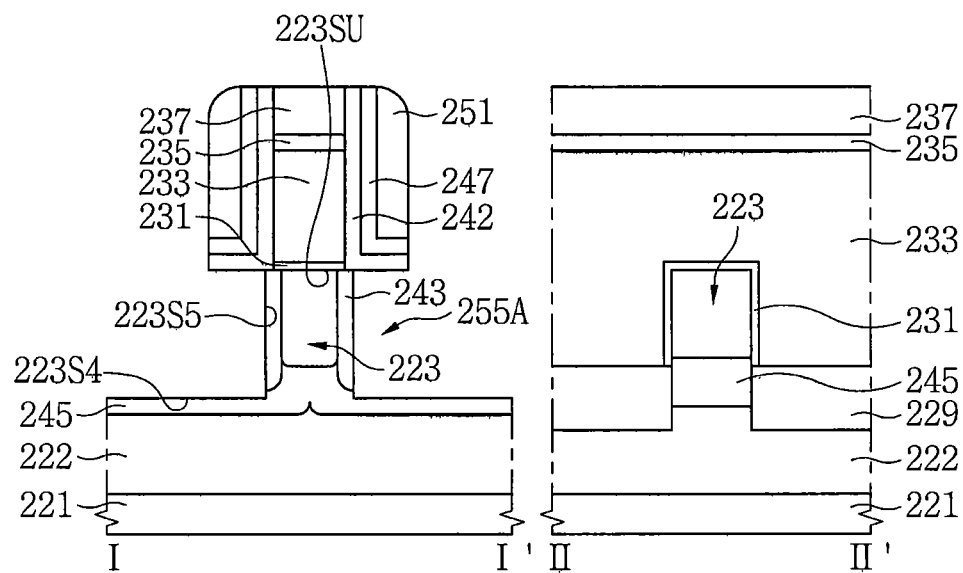

Referring to FIG. 25B, a second trench 255A may be formed in various shapes depending on crystal orientations of the active region 223. For example, the second trench 255A may be a U-shape. The second trench 255A may expose a first side surface 223S5 and the second surface 223S4. The first side surface 223S5 may be connected to the first surface 223SU. The first side surface 223S5 may be perpendicular to the first surface 223SU. The bottom of the second trench 255A may expose the second surface 223S4. The second surface 223S4 may be connected to the first side surface 223S5.

Figure 25C:
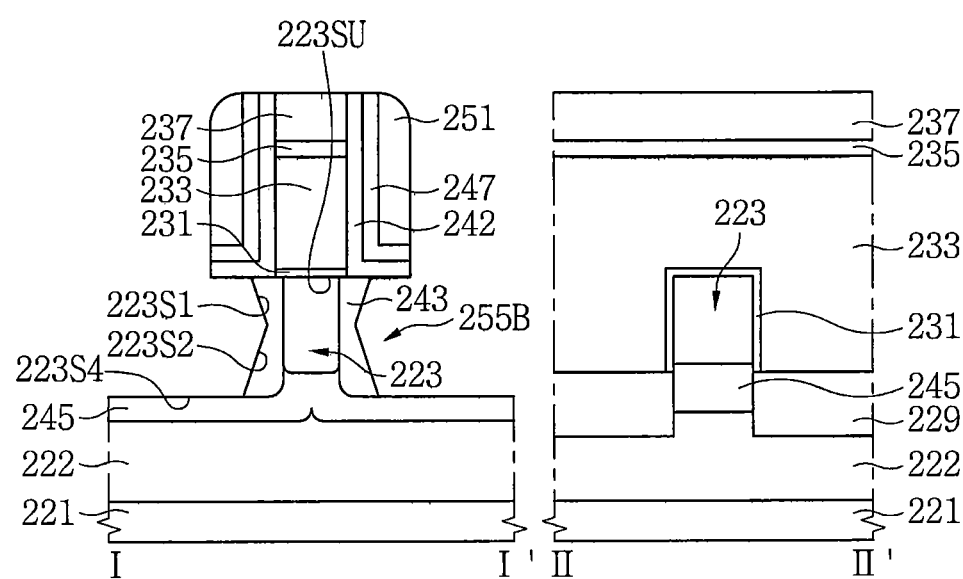

Referring to FIG. 25C, the second trench 255B may expose the first side surface 223S1, the second side surface 223 S2, and the second surface 223S4. The first side surface 223S1 may be connected to the first surface 223SU. The first side surface 223S1 may form an acute angle with respect to the first surface 223SU. The second side surface 223S2 may be formed under the first side surface 223S1. The bottom of the second trench 255B may expose the second surface 223S4. The second surface 223S4 may be connected to the second side surface 223S2.

Figure 26:
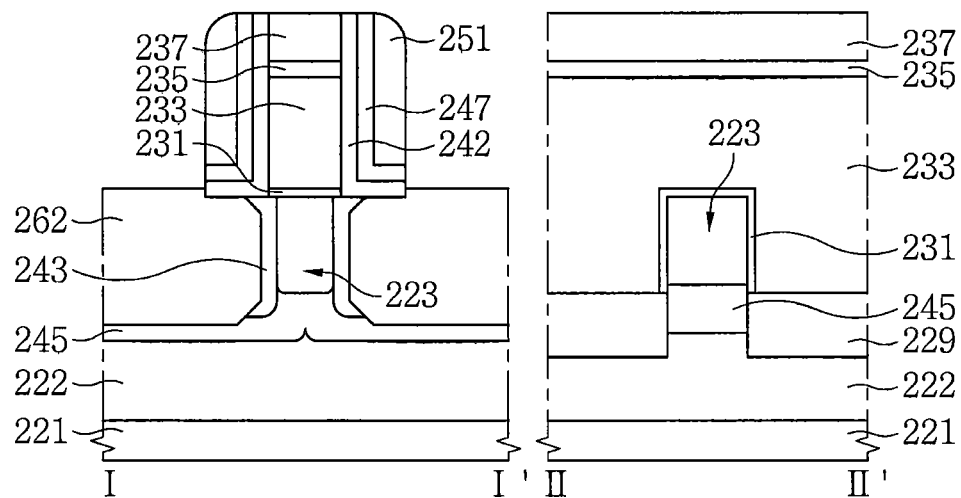

Referring to FIGS. 16 and 26, a second semiconductor layer 262 may be formed in the second trench 255. The second semiconductor layer 262 may include B-doped single crystalline SiGe formed by a SEG method. The Ge content in the second semiconductor layer 262 may be 25 to 50%. The second semiconductor layer 262 may contain 1E20 to 3E20 atoms/cm3 of boron (B). The second semiconductor layer 262 may fully fill the second trench 255. An upper end of the second semiconductor layer 262 may be at a higher level than the active region 223.

Figure 27:
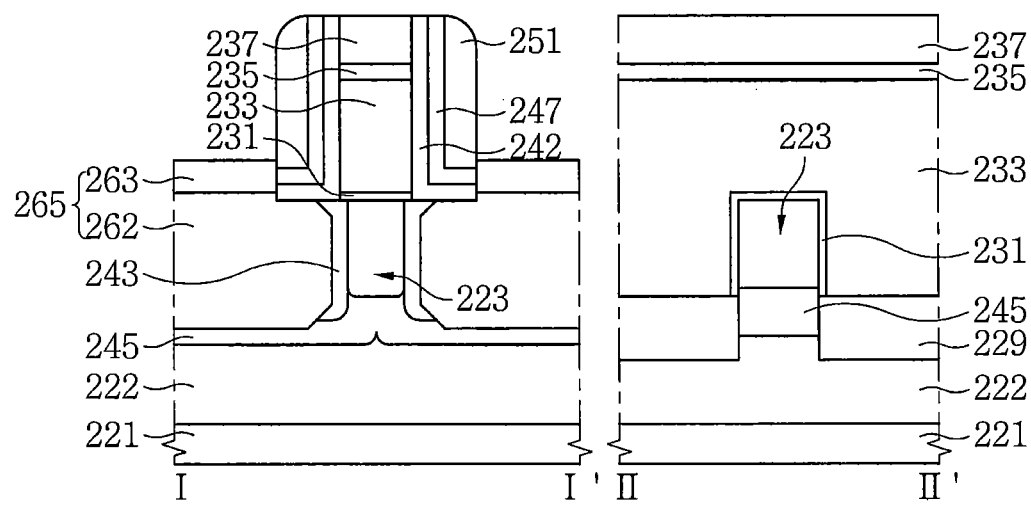

Referring to FIGS. 16 and 27, a third semiconductor layer 263 may be formed on the second semiconductor layer 262. The third semiconductor layer 263 may include B-doped single crystalline Si formed by a SEG method. The third semiconductor layer 263 may contain 1E20 to 3E20 atoms/cm3 of boron (B). The second semiconductor layer 262 and the third semiconductor layer 263 may form an embedded stressor 265. In some embodiments, the third semiconductor layer 263 may be omitted.

Figure 28:
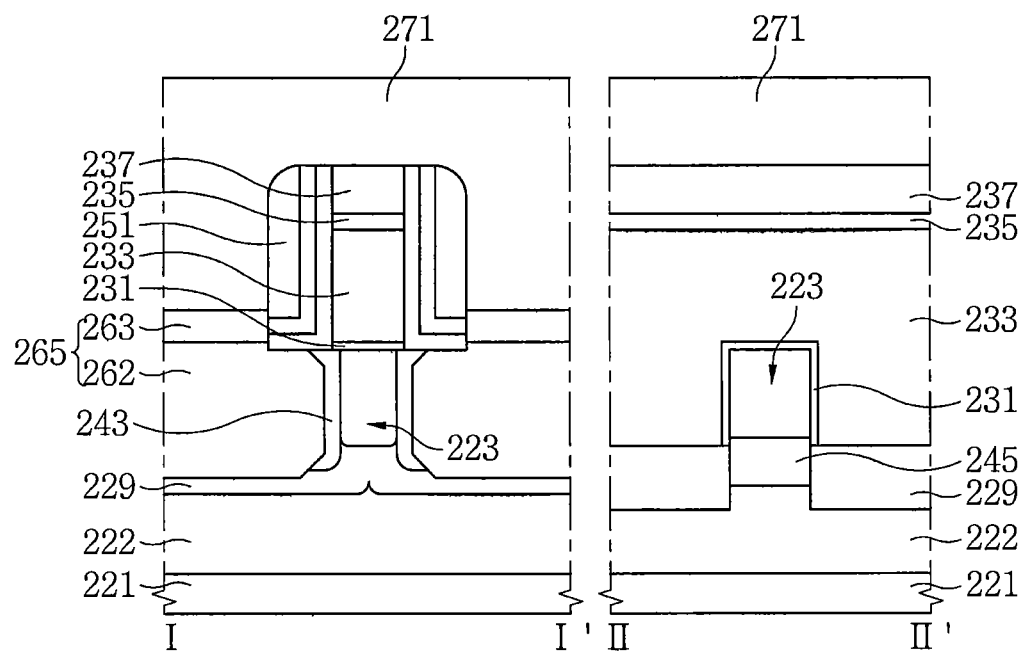

Referring to FIGS. 16 and 28, an interlayer insulating layer 271 may be formed on the substrate 221.

Figure 29:
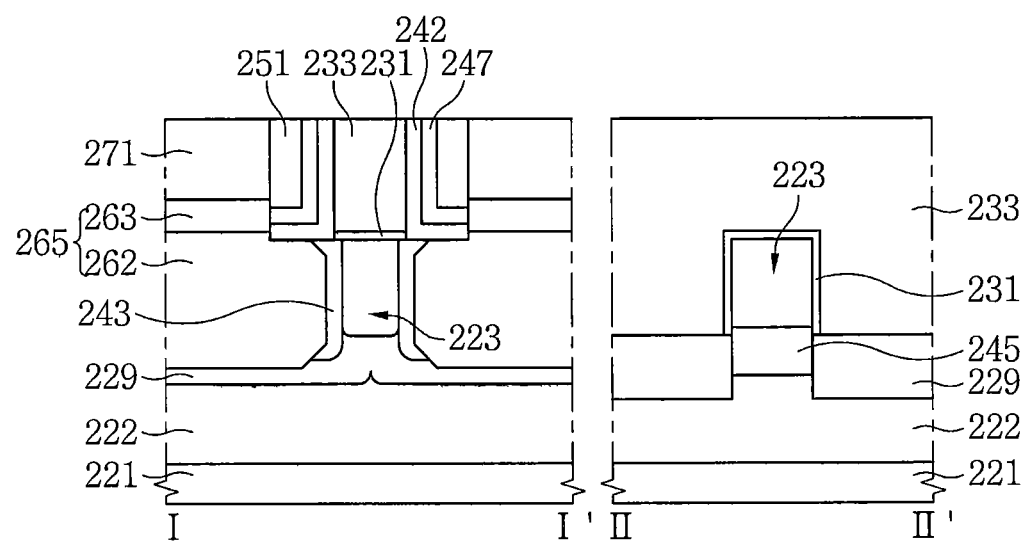

Referring to FIGS. 16 and 29, the temporary gate electrode 233 may be exposed by partially removing the interlayer insulating layer 271 and removing the second mask pattern 237 and the first mask pattern 235.

Figure 30:
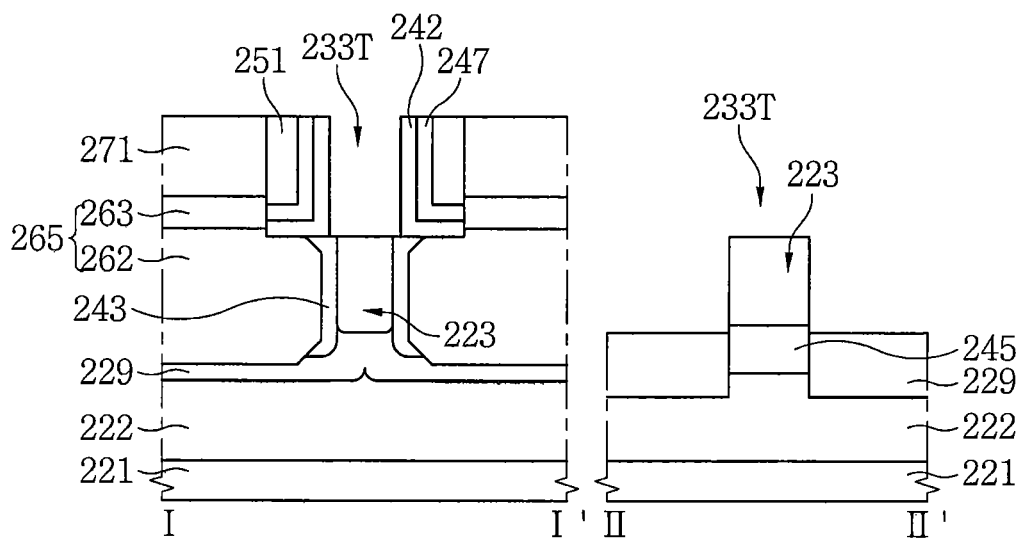

Referring to FIGS. 16 and 30, the temporary gate electrode 233 and the temporary gate dielectric layer 231 may be removed to form a gate trench 233T exposing the active region 223.

Figure 31A:
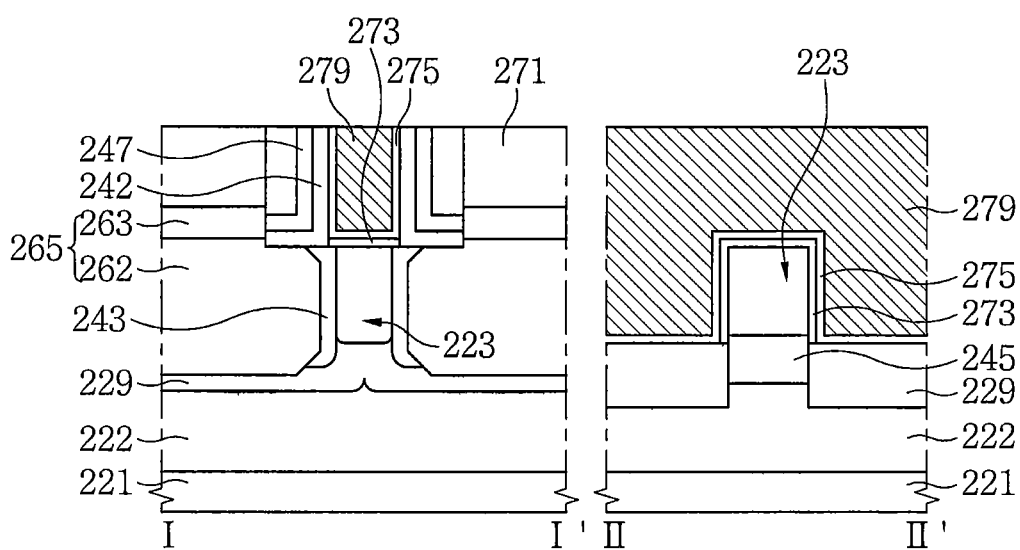

Referring to FIGS. 16 and 31A, a first gate dielectric layer 273, a second gate dielectric layer 275, and a gate electrode 279 may be formed in the gate trench 233T. The embedded stressor 265 may have a wedge-shape.

The first gate dielectric layer 273 may be formed on the active region 223. The first gate dielectric layer 273 may be referred to as an interfacial oxide layer. The first gate dielectric layer 273 may be formed by a cleaning process. The first gate dielectric layer 273 may include silicon oxide. The second gate dielectric layer 275 may include silicon oxide, silicon nitride, silicon oxy-nitride, a high-K dielectric layer, or a combination thereof. The second gate dielectric layer 275 may surround a side and a bottom of the gate electrode 279. The first gate dielectric layer 273 may be interposed between the active region 223 and the second gate dielectric layer 275.

Figure 31B:
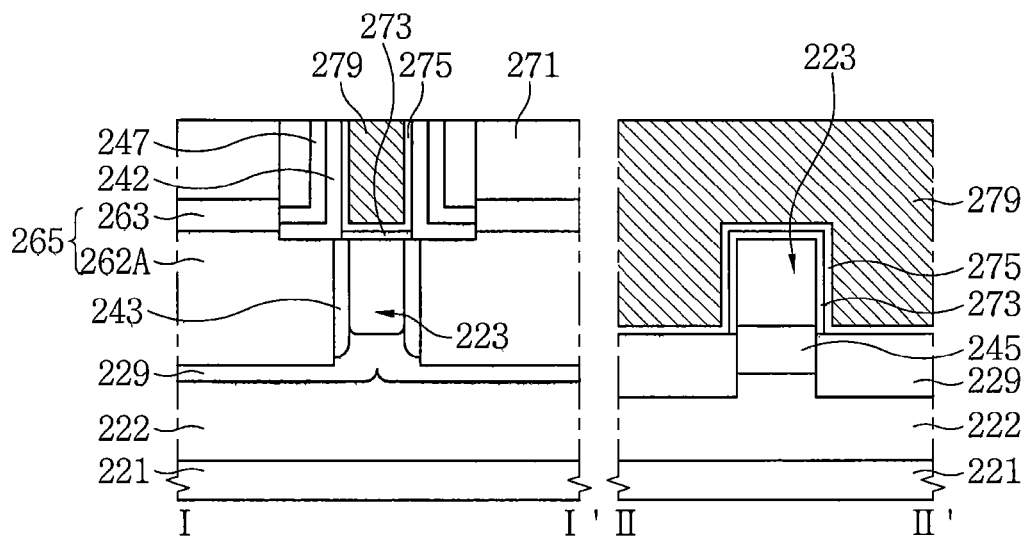

Referring to FIG. 31B, the embedded stressor 265 may include a second semiconductor layer 262A and a third semiconductor layer 263. The embedded stressor 265 may be a U-shape.

Figure 31C:
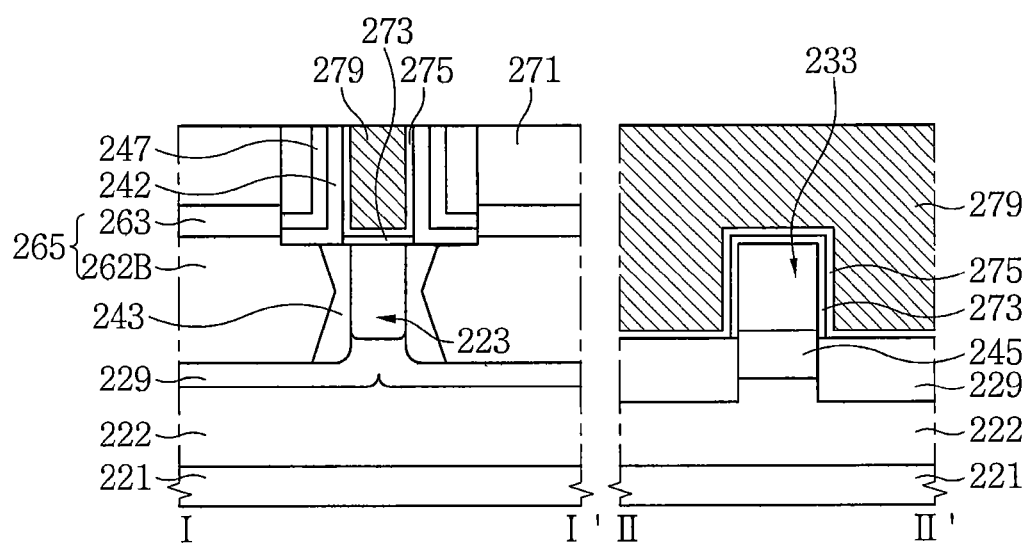

Referring to FIG. 31C, the embedded stressor 265 may include a second semiconductor layer 262B and a third semiconductor layer 263. The embedded stressor 265 may be a pyramid-shape or a pencil-shape.

Figure 32:
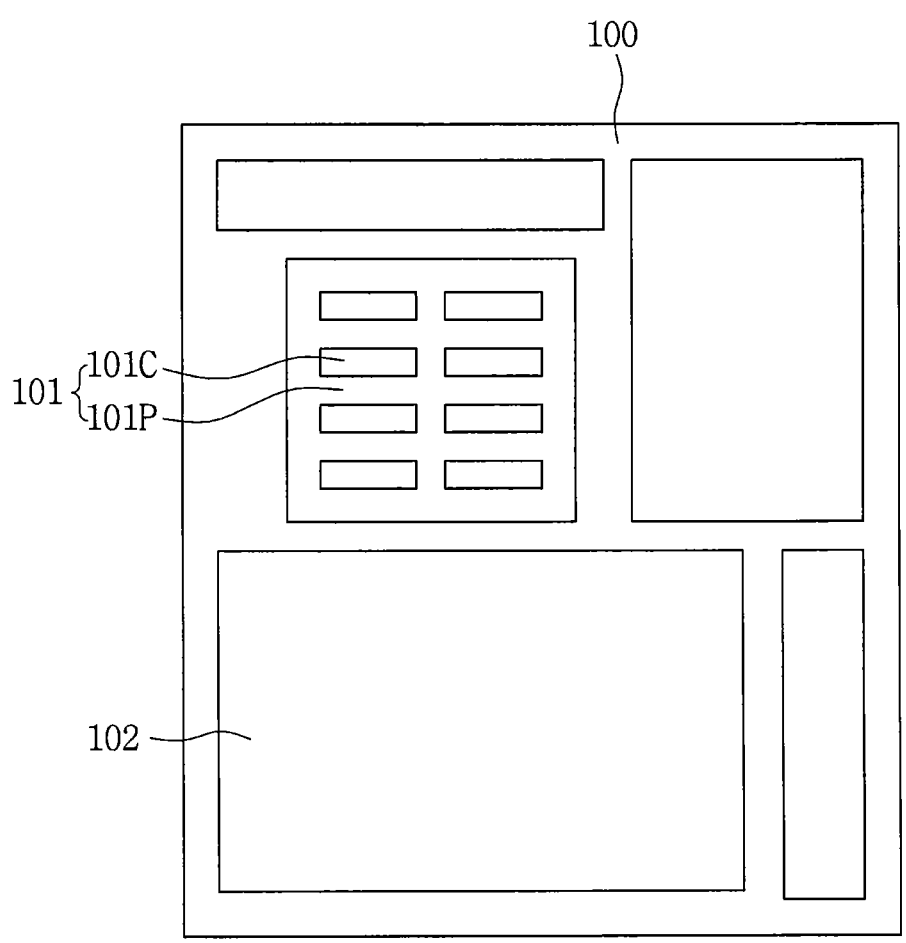
FIG. 32 is a layout of a semiconductor device according to some embodiments of the present inventive concepts.

FIG. 32 is a layout of a semiconductor device according to some embodiments of the present inventive concepts. FIGS. 33-38 are cross-sectional views illustrating intermediate structures provided in operations of forming a semiconductor device according to some embodiments of the present inventive concepts.

Referring to FIG. 32, a semiconductor chip 100 may include a first region 102 and a second region 101C. The first region 102 may be referred to as a logic region. The second region 101C may be referred to as a cell array region. A plurality of PMOS transistors may be formed in the first region 102 and the second region 101C. The second region 101C may have a pattern density higher than that of the first region 102.

The semiconductor chip 100 may be a microprocessor. The semiconductor chip 100 may include a memory region 101. The memory region 101 may include the second region 101C and an SRAM-peripheral region 101P. The second region 101C may include memory cells such as an SRAM. The first region 102 may be formed adjacent to the memory region 101.

Figure 33:
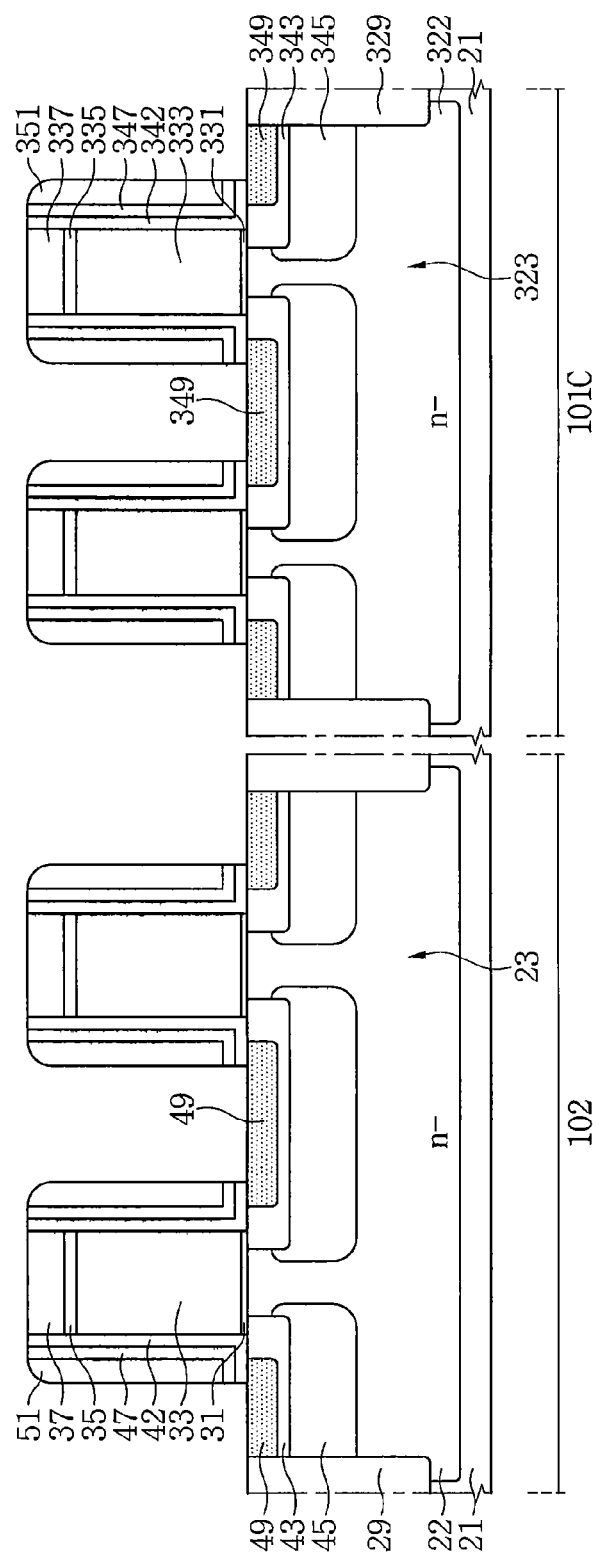
FIGS. 33-38 are cross-sectional views illustrating intermediate structures provided in operations of forming a semiconductor device according to some embodiments of the present inventive concepts.

Referring to FIGS. 32 and 33, a first well 22, a first active region 23, a first device isolation layer 29, a first buffer layer 31, a first temporary gate electrode 33, a first lower mask pattern 35, and a first upper mask pattern 37 may be formed in the first region 102 of a substrate 21. The substrate 21 may include first conductivity-type impurities. The first well 22 may include second conductivity-type impurities different from the first conductivity-type impurities. Hereinafter, the description will be made under the assumption that the first conductivity is p-type and the second conductivity is n-type.

The first active region 23 may be confined to the first well 22 by the first device isolation layer 29. The first temporary gate electrode 33 may be formed to cross the first active region 23. The first upper mask pattern 37, the first lower mask pattern 35, the first temporary gate electrode 33, and the first buffer layer 31 may be referred to as a first temporary gate pattern 31, 33, 35, and 37. The first temporary gate pattern 31, 33, 35, and 37 may cross the first active region 23. A plurality of the first temporary gate patterns 31, 33, 35, and 37 may be formed in parallel on the first active region 23.

A first inner spacer 42 may be formed on a sidewall of the first temporary gate electrode 33. A first LDD 43 may be formed by implanting the first conductivity-type impurities in the first active region 23 using the first inner spacer 42, the first upper mask pattern 37, the first lower mask pattern 35, and the first temporary gate electrode 33 as an ion-implantation mask. A first halo 45 may be formed by implanting the second conductivity-type impurities in the first active region 23. The first halo 45 may cover a side and a bottom of the first LDD 43. The formation of the first LDD 43 and the first halo 45 may include an ion-implantation process and a heat treatment process.

A first intermediate spacer 47 may be formed on the first inner spacer 42. A first faster etch rate part 49 may be formed in the first active region 23 using the first intermediate spacer 47 as an ion-implantation mask. A first outer spacer 51 may be formed on the first intermediate spacer 47. The formation of the first outer spacer 51 may include a thin film formation process and an anisotropic etching process. An upper surface of the first faster etch rate part 49 may be exposed.

A second well 322, a second active region 323, a second device isolation layer 329, a second buffer layer 331, a second temporary gate electrode 333, a second lower mask pattern 335, and a second upper mask pattern 337 may be formed in the second region 101C of the substrate 21. The second well 322 may include second conductivity-type impurities.

The second active region 323 may be confined to the second well 322 by the second device isolation layer 329. The second temporary gate electrode 333 may be formed to cross the second active region 323. The second upper mask pattern 337, the second lower mask pattern 335, the second temporary gate electrode 333, and the second buffer layer 331 may be referred to as a second temporary gate pattern 331, 333, 335, and 337. The second temporary gate pattern 331, 333, 335, and 337 may cross the second active region 323. A plurality of the second temporary gate patterns 331, 333, 335, and 337 may be formed in parallel on the second active region 323.

A second inner spacer 342 may be formed on a sidewall of the second temporary gate electrode 333. A second LDD 343 may be formed by implanting the first conductivity-type impurities in the second active region 323 using the second inner spacer 342, the second upper mask pattern 337, the second lower mask pattern 335, and the second temporary gate electrode 333 as an ion-implantation mask. A second halo 345 may be formed by implanting the second conductivity-type impurities in the second active region 323. The second halo 345 may cover a side and a bottom of the second LDD 343. The formation of the second LDD 343 and the second halo 345 may include an ion-implantation process and a heat treatment process.

A second intermediate spacer 347 may be formed on the second inner spacer 342. A second faster etch rate part 349 may be formed in the second active region 323 using the second intermediate spacer 347 as an ion-implantation mask. A second outer spacer 351 may be formed on the second intermediate spacer 347. The formation of the second outer spacer 351 may include a thin film formation process and an anisotropic etching process. An upper surface of the second faster etch rate part 349 may be exposed.

The first LDD 43 and the second LDD 343 may contain boron. The second LDD 343 may have a boron concentration higher than that of the first LDD 43. The first faster etch rate part 49 and the second faster etch rate part 349 may contain phosphorous. The second faster etch rate part 349 may have a phosphorous concentration lower than that of the first faster etch rate part 49.

In some embodiments, the second LDD 343 may contain a boron concentration higher than that of the first LDD 43, and the second faster etch rate part 349 may contain a phosphorous concentration lower than that of the first faster etch rate part 49. In some embodiments, the second faster etch rate part 349 may be omitted.

Figure 34:
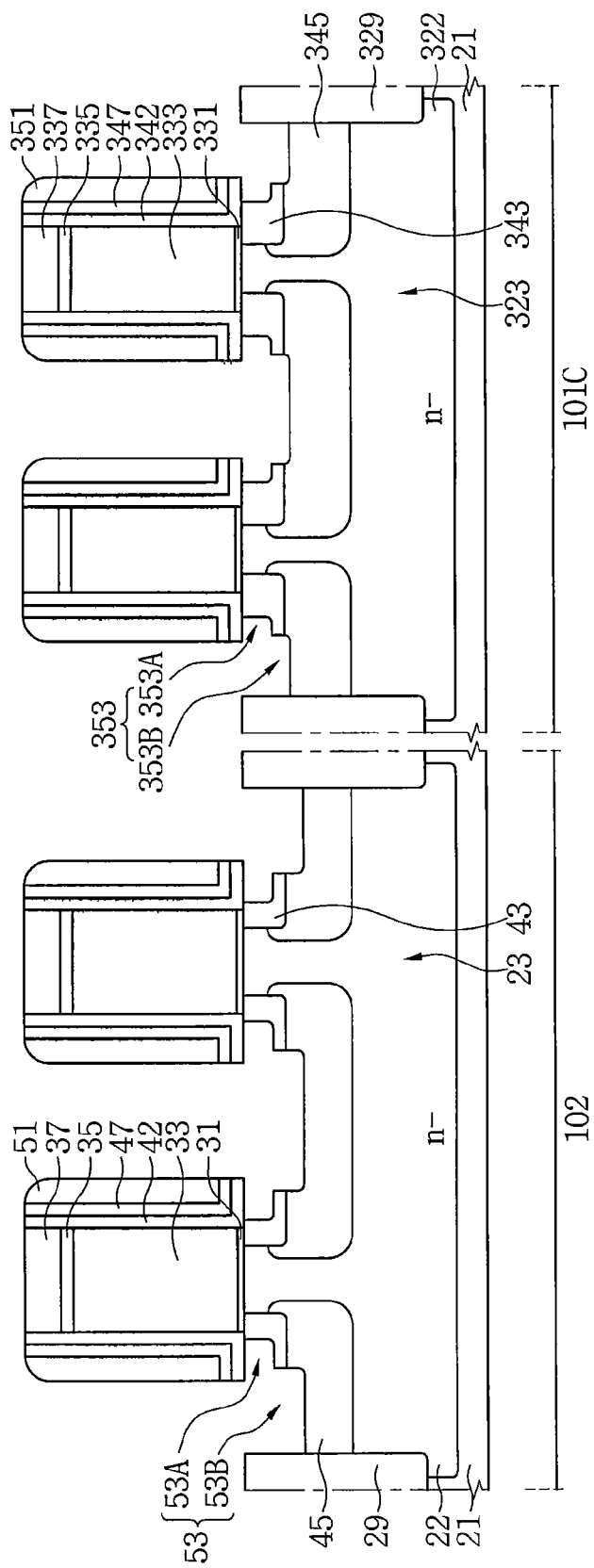

Referring to FIGS. 32 and 34, the first faster etch rate part 49, the first LDD 43, and the first halo 45 may be etched to form a first preliminary trench 53. The first preliminary trench 53 may include a first upper trench 53A aligned with the first faster etch rate part 49 and a first lower trench 53B connected to a bottom of the first upper trench 53A. The first upper trench 53A may be formed in the first LDD 43. The first lower trench 53B may pass through the first LDD 43 to be formed in the first halo 45. The first lower trench 53B may have a width smaller than a width of the first upper trench 53A. A sidewall of the first preliminary trench 53 may have a step. For example, a sidewall of the first LDD 43, which is exposed by the first upper trench 53A and the first lower trench 53B, may have a step.

The second faster etch rate part 349, the second LDD 343, and the second halo 345 may be etched to form a second preliminary trench 353. The second preliminary trench 353 may include a second upper trench 353A aligned with the second faster etch rate part 349 and a second lower trench 353B connected to a bottom of the second upper trench 353A. The second upper trench 353A may be formed in the second LDD 343. The second lower trench 353B may pass through the second LDD 343 to be formed in the second halo 345. The second lower trench 353B may have a width smaller than that of the second upper trench 353A. A sidewall of the second preliminary trench 353 may have a step. For example, a sidewall of the second LDD 343, which is exposed by the second upper trench 353A and the second lower trench 353B, may have a step.

The formation of the first preliminary trench 53 and the second preliminary trench 353 may include a dry-etch process, a wet-etch process, or a combination thereof. The formation of the first preliminary trench 53 and the second preliminary trench 353 may include an isotropic etching process, an anisotropic etching process, or a combination thereof. For example, the formation of the first preliminary trench 53 and the second preliminary trench 353 may include an isotropic dry-etch process using HBr, $CF_4$, $O_2$, $Cl_2$, $NF_3$, or a combination thereof. According to some embodiments, the second LDD 343 having a boron concentration higher than that of the first LDD 43 may have an etch rate lower than that of the first LDD 43. According to some embodiments, the second faster etch rate part 349 having a phosphorous concentration lower than that of the first faster etch rate part 49 may have a lower etch rate than the first faster etch rate part 49.

Depending on the configuration of the first faster etch rate part 49, the second faster etch rate part 349, the first LDD 43, and the second LDD 343, sizes and shapes of the first upper trench 53A, the first lower trench 53B, the second upper trench 353A, and the second lower trench 353B may be determined. Using the configuration of the first faster etch rate part 49, the second faster etch rate part 349, the first LDD 43, and the second LDD 343, the sizes, the shapes, and the positions of the first preliminary trench 53 and the second preliminary trench 353 may be controlled as desired.

Figure 35:
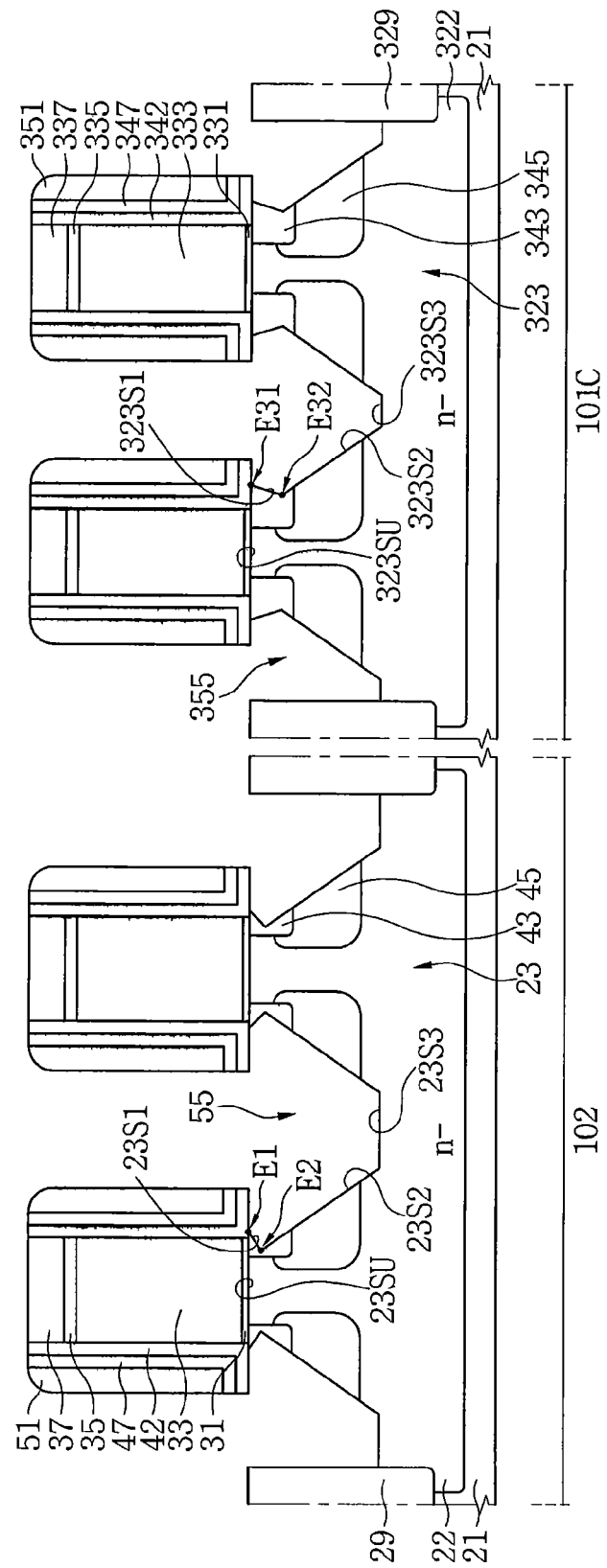

Referring to FIGS. 32 and 35, a first trench 55 in the first active region 23 and a second trench 355 in the second active region 323 may be formed using a directional etch process. For example, the formation of the first trench 55 and the second trench 355 may include a wet-etch process using NH4OH, NH3OH, TMAH (Tetra Methyl Ammonium Hydroxide), KOH, NaOH, BTMH (benzyltrimethylammonium hydroxide), or a combination thereof.

The first active region 23 may have a first sigma-shape (Σ-shape) due to the first trench 55. The first LDD 43 may be retained under the first temporary gate pattern 31, 33, 35, and 37. The first active region 23 may include a first surface 23SU, a first side surface 23S1, a second side surface 23S2, and a second surface 23S3. A first edge E1 may be defined between the first side surface 2351 and the first surface 23SU. A second edge E2 may be defined between the first side surface 23S1 and the second side surface 23S2.

The second active region 323 may have a second sigma-shape (Σ-shape) due to the second trench 355. The second LDD 343 may be retained under the second temporary gate pattern 331, 333, 335, and 337. The second active region 323 may include a third surface 323SU, a third side surface 323S1, a fourth side surface 323S2, and a fourth surface 323S3. A third edge E31 may be defined between the third side surface 323S1 and the third surface 323SU. A fourth edge E32 may be defined between the third side surface 323S1 and the fourth side surface 323S2.

The first trench 55 may be interpreted as an extension of the first preliminary trench 53, and the second trench 355 may be interpreted as an extension of the second preliminary trench 353.

Figure 36:
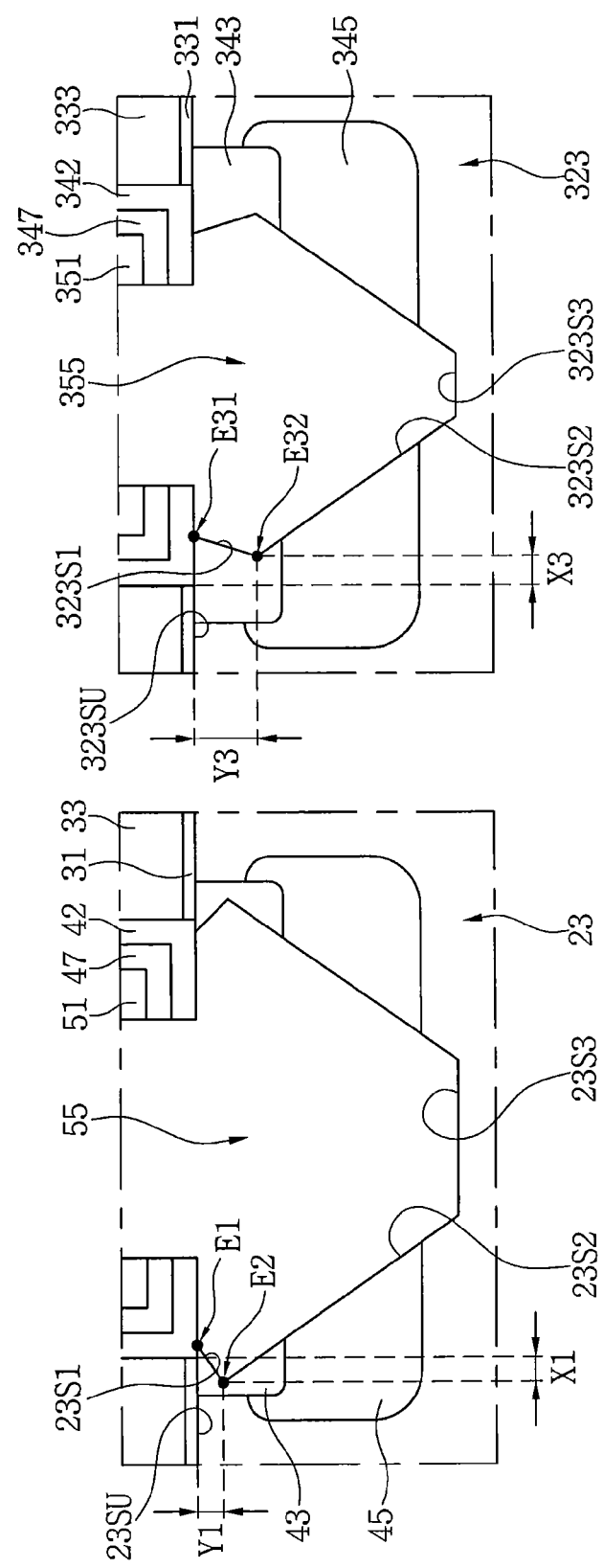

Referring to FIGS. 32 and 36, the first trench 55 may pass through the first LDD 43 and the first halo 45. The first surface 23SU may be defined on an upper end of the first active region 23. For example, the first surface 23SU may be in contact with the first buffer layer 31 and extend under the first inner spacer 42. The first trench 55 may expose the first side surface 23S1, the second side surface 23S2, and the second surface 23S3. The first side surface 23S1 may be connected to the first surface 23SU. The first side surface 23S1 may form an acute angle with respect to the first surface 23SU. The second side surface 23S2 may be formed under the first side surface 23S1. The second side surface 23S2 may have a slope different from that of the first side surface 23S1. The second side surface 23S2 may form an acute angle with respect to a horizontal extension line which is parallel to the substrate 21 and pass through the second surface 23S3. A bottom of the first trench 55 may expose the second surface 23S3. The second surface 23S3 may be connected to the second side surface 23S2. The first surface 23SU may be interpreted as an upper surface of the first active region 23.

The second trench 355 may pass through the second LDD 343 and the second halo 345. The third surface 323SU may be defined on an upper end of the second active region 323. For example, the third surface 323SU may be in contact with the second buffer layer 331 and extend under the second inner spacer 342. The second trench 355 may expose the third side surface 323S1, the fourth side surface 323S2, and the fourth surface 323S3. The third side surface 323S1 may be connected to the third surface 323SU. The third side surface 323S1 may form an acute angle with respect to the third surface 323SU. The fourth side surface 323S2 may be formed under the third side surface 323S1. The fourth side surface 323S2 may have a slope different from that of the third side surface 323S1. The fourth side surface 323S2 may form an acute angle with respect to a horizontal extension line which is parallel to the substrate 21 and pass fourth surface 323 S3. A bottom of the second trench 355 may expose the fourth surface 323S3. The fourth surface 323S3 may be connected to the fourth side surface 323S2. The third surface 323SU may be interpreted as an upper surface of the second active region 323.

Using the configuration of the first LDD 43 and the first faster etch rate part 49, the first edge E1 and the second edge E2 may be formed at desired positions. For example, first edge E1 may be formed under the first inner spacer 42, and the second edge E2 may be formed to be overlapped by the first temporary gate electrode 33. The first edge E1 and the second edge E2 may be located at a surface of the first LDD 43. The first side surface 23S1 may expose the first LDD 43. The second side surface 23S2 may expose the first LDD 43, the first halo 45, and the first active region 23.

Using the configuration of the second LDD 343 and the second faster etch rate part 349, the third edge E31 and the fourth edge E32 may be formed at a desired position. For example, the third edge E31 may be formed under the second inner spacer 342, and the fourth edge E32 may be aligned with an outer side of the second temporary gate electrode 333. The third edge E31 and the fourth edge E32 may be located on a surface of the second LDD 343. The third side surface 323S1 may expose the second LDD 343. The fourth side surface 323S2 may expose the second LDD 343, the second halo 345, and the second active region 323.

A first horizontal distance X1 may be defined between the second edge E2 and a straight line passing through a side surface of the first temporary gate electrode 33 and perpendicular to the substrate 21. A first vertical height Y1 may be defined between the second edge E2 and a straight line passing through the first surface 23SU and parallel to the substrate 21. For example, the first horizontal distance X1 may be zero to −5 nm, and the first vertical height Y1 may be 3 nm to 7 nm. It may be interpreted that when the first horizontal distance X1 is zero, the second edge E2 is vertically overlapped by the side surface of the first temporary gate electrode 33, and when the first horizontal distance X1 is a negative value, the second edge E2 is vertically overlapped by a bottom of the first temporary gate electrode 33.

A second horizontal distance X3 may be defined between the fourth edge E32 and a straight line passing through a side surface of the second temporary gate electrode 333 and perpendicular to the substrate 21. A second vertical height Y3 may be defined between the fourth edge E32 and a straight line passing through the third surface 323SU and parallel to the substrate 21. The fourth edge E32 may be formed at a lower level than the second edge E2. For example, the second horizontal distance X3 may be from +1 nm to +3 nm, and the second vertical height Y3 may be from 8 nm to 12 nm. It may be interpreted that when the second horizontal distance X3 is a positive value, the second temporary gate electrode 333 does not overlap the fourth edge E32.

Figure 37:
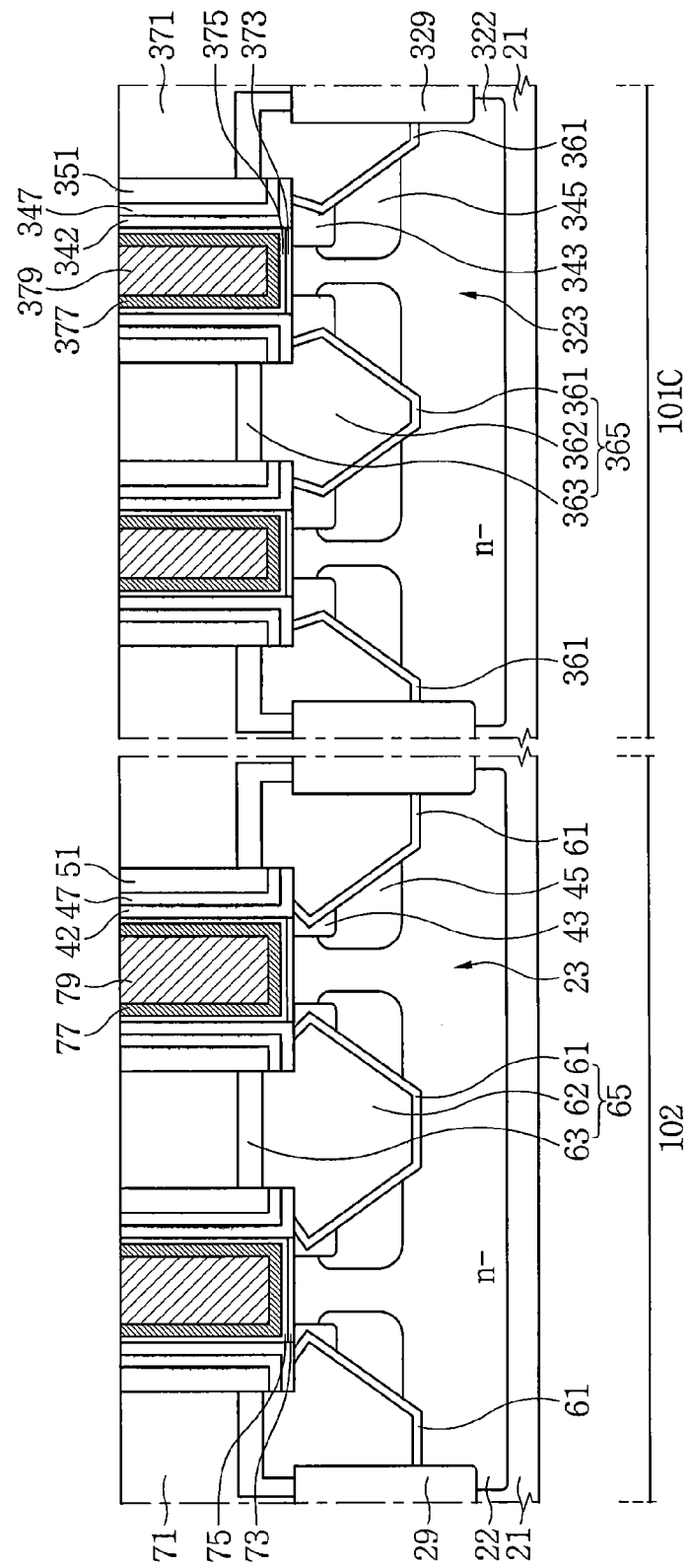

Referring to FIGS. 32 and 37, a first semiconductor layer 61 may be formed in the first trench 55. A second semiconductor layer 62 may be formed on the first semiconductor layer 61. A third semiconductor layer 63 may be formed on the second semiconductor layer 62. The first semiconductor layer 61, the second semiconductor layer 62, and the third semiconductor layer 63 may form a first embedded stressor 65.

A fourth semiconductor layer 361 may be formed in the second trench 355. A fifth semiconductor layer 362 may be formed on the fourth semiconductor layer 361. A sixth semiconductor layer 363 may be formed on the fifth semiconductor layer 362. The fourth semiconductor layer 361, the fifth semiconductor layer 362, and the sixth semiconductor layer 363 may form a second embedded stressor 365. The fourth semiconductor layer 361 may include the same material layer formed concurrently with the first semiconductor layer 61, the fifth semiconductor layer 362 may include the same material layer formed concurrently with the second semiconductor layer 62, and the sixth semiconductor layer 363 may include the same material layer formed concurrently with the third semiconductor layer 63.

A first interlayer insulating layer 71 and a second interlayer insulating layer 371 may be formed on the substrate 21. The first temporary gate pattern 31, 33, 35, and 37 may be removed to expose the first active region 23, and the second temporary gate pattern 331, 333, 335, and 337 may be removed to expose the second active region 323.

A first gate dielectric layer 73, a second gate dielectric layer 75, a first gate electrode 77, and a second gate electrode 79 may be formed on the first active region 23. A third gate dielectric layer 373, a fourth gate dielectric layer 375, a third gate electrode 377, and a fourth gate electrode 379 may be formed on the second active region 323. The third gate dielectric layer 373 may have a similar configuration to the first gate dielectric layer 73, the fourth gate dielectric layer 375 may have a similar configuration to the second gate dielectric layer 75, the third gate electrode 377 may have a similar configuration to the first gate electrode 77, and the fourth gate electrode 379 may have a similar configuration to the second gate electrode 79.

Figure 38:
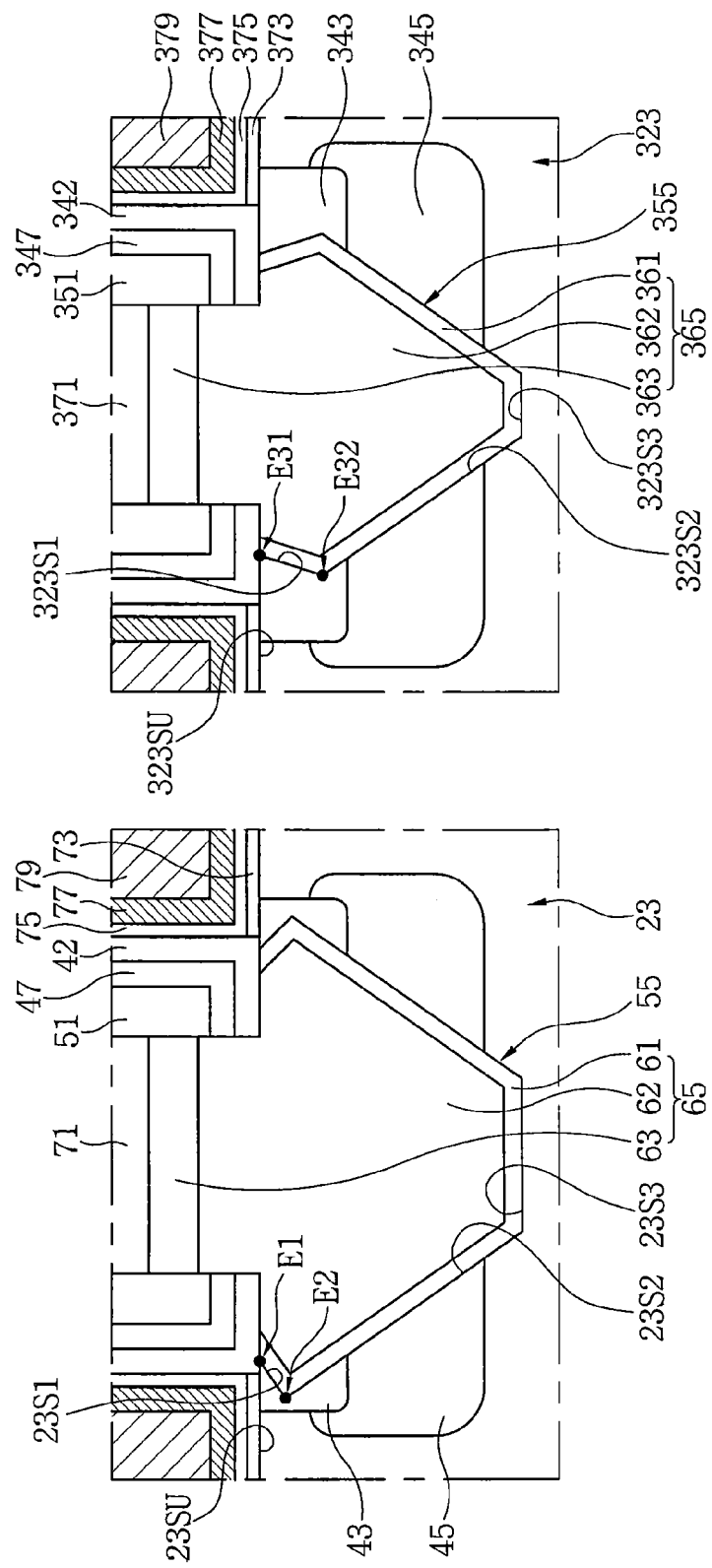

Referring to FIGS. 32 and 38, the first embedded stressor 65 may pass through the first LDD 43 and the first halo 45 to be in contact with the first active region 23. A bottom of the first embedded stressor 65 may be formed at a lower level than the first halo 45. The first embedded stressor 65 may be in contact with the first side surface 23S1 and the second side surface 23S2. The second embedded stressor 365 may pass through the second LDD 343 and the second halo 345 to be in contact with the second active region 323. A bottom of the second embedded stressor 365 may be formed at a lower level than the second halo 345. The second embedded stressor 365 may be in contact with the third side surface 323S1 and the fourth side surface 323S2.

The second edge E2 may be formed on a surface of the first LDD 43, and the fourth edge E32 may be formed on a surface of the second LDD 343. The second edge E2 may be formed at a higher level than the fourth edge E32. The second edge E2 may overlap a bottom of the first gate electrode 77, and the fourth edge E32 may be aligned with an outer side of the third gate electrode 377.

Figure 39:
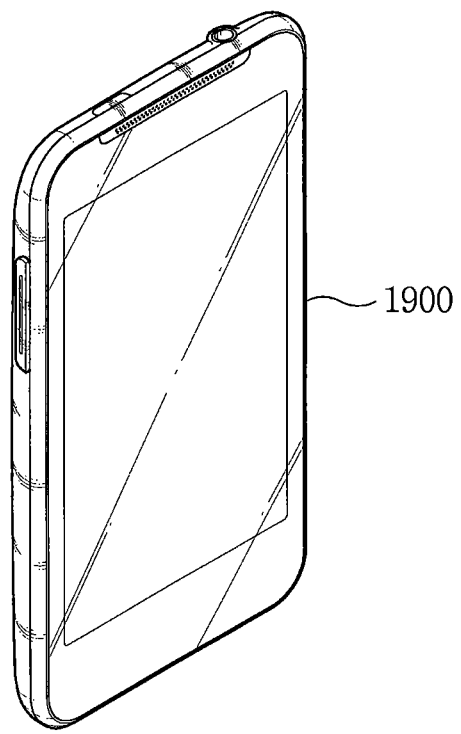
FIGS. 39 and 40 are a perspective view and a block diagram of an electronic apparatus, respectively, according to some embodiments of the present inventive concepts.
Figure 40:
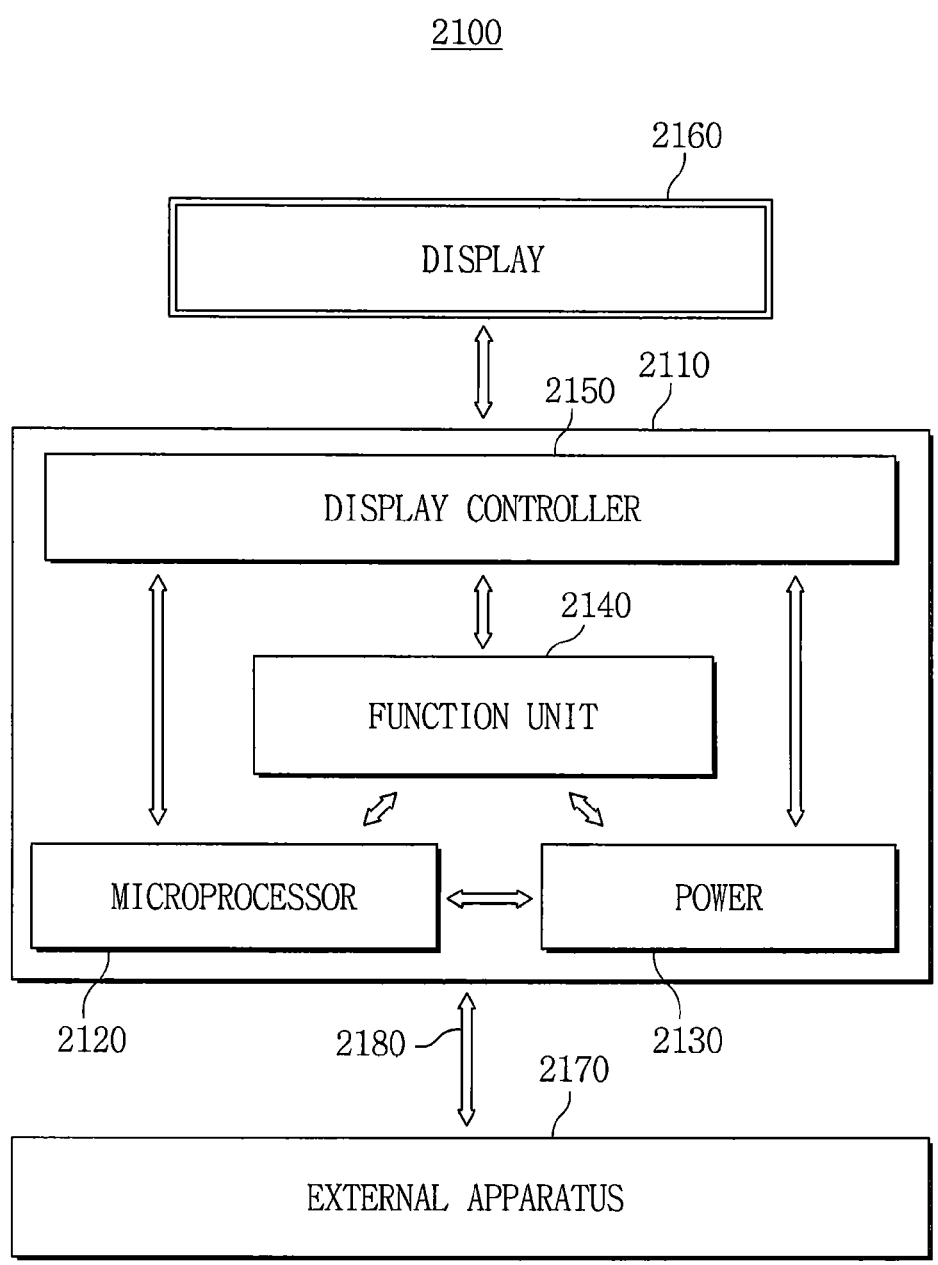

FIGS. 39 and 40 are a perspective view and a block diagram of an electronic apparatus, respectively, according to some embodiments of the present inventive concepts. Referring to FIG. 39, the semiconductor device according to some embodiments may be applied to electronic systems such as a smart phone 1900, a netbook, a notebook, or a tablet PC. For example, the semiconductor device according to some embodiments may be installed in a main board of the smart phone 1900. Further, the semiconductor device according to some embodiments may be provided to an expansion apparatus such as an external memory card to be combined with the smart phone 1900.

Referring to FIG. 40, the semiconductor device according to some embodiments may be applied to an electronic system 2100. The electronic system 2100 may include a body 2110, a microprocessor unit 2120, a power unit 2130, a function unit 2140, and/or a display controller unit 2150. The body 2110 may be a motherboard formed of a printed circuit board (PCB). The microprocessor unit 2120, the power unit 2130, the function unit 2140, and the display controller unit 2150 may be mounted or installed on the body 2110. A display unit 2160 may be arranged inside or outside of the body 2110. For example, the display unit 2160 may be arranged on a surface of the body 2110 and display an image processed by the display controller unit 2150.

The power unit 2130 may receive a constant voltage from an external battery, etc., divide the voltage into various levels, and supply those voltages to the microprocessor unit 2120, the function unit 2140, and the display controller unit 2150, etc. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components which can perform mobile phone functions such as output of an image to the display unit 2160 or output of a voice to a speaker, by dialing or communication with an external apparatus 2170. If a camera is installed, the function unit 2140 may function as an image processor.

According to some embodiments, when the electronic system 2100 is connected to a memory card, etc. in order to expand capacity, the function unit 2140 may be a memory card controller. The function unit 2140 may exchange signals with the external apparatus 2170 through a wired or wireless communication unit 2180. In addition, when the electronic system 2100 needs a universal serial bus (USB), etc. in order to expand functionality, the function unit 2140 may function as an interface controller. Further, the function unit 2140 may include a mass storage apparatus.

The semiconductor device according to some embodiments may be applied to the function unit 2140 or the microprocessor unit 2120. For example, the microprocessor unit 2120 may include the embedded stressor 65. The microprocessor unit 2120 may have good electrical characteristics due to the configuration of the embedded stressor 65.

Figure 41:
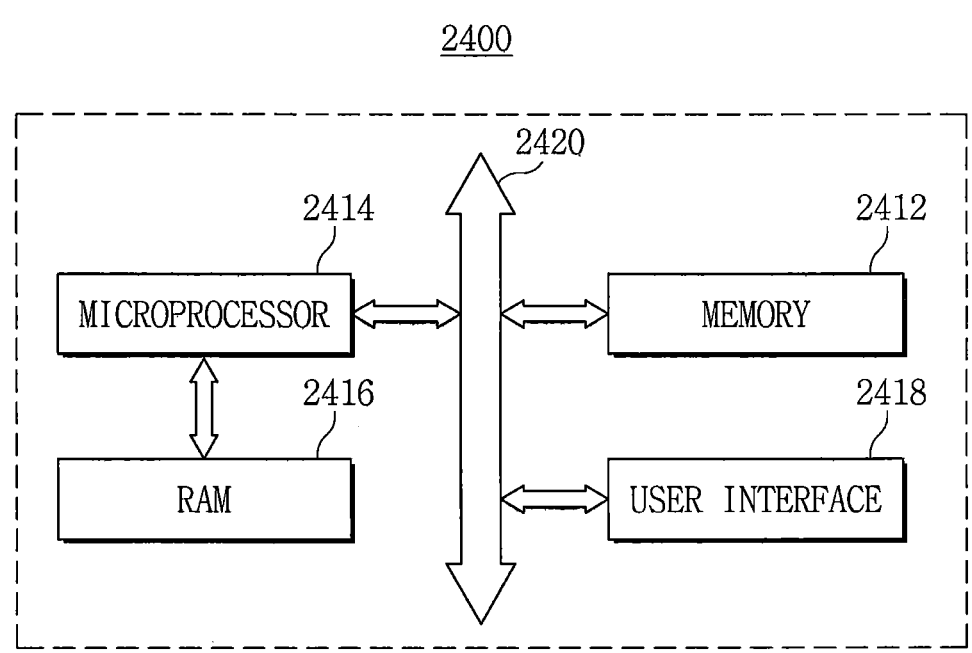
FIG. 41 is a block diagram of an electronic system according to some embodiments of the present inventive concepts.

FIG. 41 is a block diagram of an electronic system according to some embodiments of the present inventive concepts. Referring to FIG. 41, the electronic system 2400 may include at least one of semiconductor devices according to some embodiments. The electronic system 2400 may be used to fabricate a mobile apparatus or a computer. For example, the electronic system 2400 may include a memory system 2412, a microprocessor 2414, a random access memory (RAM) 2416, a bus 2420, and a user interface 2418. The microprocessor 2414, the memory system 2412, and the user interface 2418 may be connected each other via the bus 2420. The user interface 2418 may be used to input/output data to/from the electronic system 2400. The microprocessor 2414 may program and control the electronic system 2400. The RAM 2416 may be used as an operation memory of the microprocessor 2414. The microprocessor 2414, the RAM 2416, and/or other components may be assembled in a single package. The memory system 2412 may store codes for operating the microprocessor 2414, data processed by the microprocessor 2414, or external input data. The memory system 2412 may include a controller and a memory.

The microprocessor 2414, the RAM 2416, or the memory system 2412 may include the semiconductor device according to some embodiments. For example, the microprocessor 2414 may include the embedded stressor 65. The microprocessor 2414 may have good electrical characteristics due to the configuration of the embedded stressor 65.

Semiconductor devices according to some embodiments may include an embedded stressor filling a trench formed in an active region. The formation of the trench may include forming a faster etch rate part by implanting phosphorous in an LDD, forming a first trench by isotropically etching the faster etch rate part, and forming a second trench using a directional etch process. The embedded stressor may fill the trench. Semiconductor devices according to some embodiments may have good electrical characteristics because the control of a size, a shape, and a position of the embedded stressor may be easy/improved, the pattern-loading effect may be reduced/minimized, and variation according to the position of the active region between the center area and an edge area may be reduced.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
a gate structure on the substrate;
a spacer adjacent to a sidewall of the gate structure; and
a semiconductor layer disposed adjacent to the sidewall of the gate structure and disposed in a recess that extends below an upper surface of the substrate, the semiconductor layer being a strain-inducing pattern,
wherein a portion of the recess underlies the gate structure,
wherein the semiconductor layer comprises a portion that is in the substrate and directly contacts a lower surface of the spacer, and an interface between the spacer and the portion of the semiconductor layer is not below a lower surface of the gate structure, and
wherein the portion of the semiconductor layer comprises a first sidewall that has a linear shape and directly contacts the lower surface of the spacer, and the first sidewall of the portion of the semiconductor layer forms an acute angle with the lower surface of the spacer and extends beyond the sidewall of the gate structure.

2. The semiconductor device of claim 1, wherein the interface between the spacer and the portion of the semiconductor layer is coplanar with the lower surface of the gate structure.

3. The semiconductor device of claim 1, wherein the gate structure includes a gate dielectric and a gate electrode over the gate dielectric.

4. The semiconductor device of claim 1, wherein the gate structure comprises a gate electrode, a first gate dielectric layer, and a second gate dielectric layer comprising a high-K dielectric material, and
the portion of the recess underlies the gate electrode, the first gate dielectric layer or the second gate dielectric layer.

5. The semiconductor device of claim 1, wherein the portion of the semiconductor layer comprises a second sidewall that has a linear shape and directly contacts the first sidewall of the portion of the semiconductor layer,
wherein the first sidewall and the second sidewall converge at a convergence interface, and
wherein the gate structure overlaps the convergence interface.

6. The semiconductor device of claim 3, wherein the spacer contacts the gate electrode.

7. The semiconductor device of claim 3, further comprising at least one nitride layer between the spacer and the gate electrode.

8. The semiconductor device of claim 3, wherein the gate structure includes a high-K dielectric material.

9. The semiconductor device of claim 5, further comprising a lightly doped drain (LDD) region in the substrate, wherein the convergence interface directly contacts the LDD region.

10. The semiconductor device of claim 5, wherein the portion of the semiconductor layer is spaced apart from the lower surface of the gate structure, and
wherein a distance between the lower surface of the gate structure and the convergence interface is from 3 nm to 7 nm.

11. The semiconductor device of claim 8, wherein the spacer contacts the gate electrode.

12. The semiconductor device of claim 8, further comprising at least one nitride layer between the spacer and the gate electrode.

13. The semiconductor device of claim 9, wherein the LDD region comprises a first impurity having a p-conductivity type and phosphorous (P).

14. The semiconductor device of claim 9, wherein the LDD region comprises a first impurity having a p-conductivity type, and the spacer comprises a second impurity having an n-conductivity type.

15. The semiconductor device of claim 13, wherein a phosphorous concentration in the LDD region is in a range of from 5E18 to 1E19 atoms/cm$^3$.

16. A semiconductor device comprising:
a substrate;
a gate structure including a gate dielectric layer over the substrate and a gate electrode over the gate dielectric layer;
a spacer adjacent to a sidewall of the gate electrode; and
a semiconductor layer disposed adjacent to the gate structure and disposed in a recess that extends below an upper surface of the substrate, the semiconductor layer being a strain-inducing pattern,
wherein a portion of the recess underlies the gate structure,
wherein the spacer directly contacts a first portion of the semiconductor layer above a lower surface of the gate dielectric layer,
wherein the semiconductor layer comprises a second portion in the substrate, and the second portion of the semiconductor layer comprises a first sidewall that directly contacts the upper surface of the substrate and has a linear shape and a second sidewall that directly contacts the first sidewall and has a linear shape,
wherein the first and second sidewalls of the second portion of the semiconductor layer are slanted with respect to the upper surface of the substrate and converge at a convergence interface, and
wherein the gate electrode overlaps the convergence interface.

17. The semiconductor device of claim 16, wherein an interface between the spacer and the semiconductor layer located under the spacer is not below a lower surface of the gate structure.

18. The semiconductor device of claim 16, wherein the first and second sidewalls of the second portion of the semiconductor layer are in the same crystal plane.

19. The semiconductor device of claim 16, further comprising a lightly doped drain (LDD) region in the substrate, wherein the LDD region comprises a first impurity having a p-conductivity type and phosphorous (P).

20. The semiconductor device of claim 19, wherein the convergence interface directly contacts the LDD region.

21. A method for forming a semiconductor device, the method comprising:
forming a gate structure over a semiconductor substrate, the gate structure including a gate insulating layer and a gate electrode over the gate insulating layer;
forming a first spacer over the semiconductor substrate;
forming a second spacer along a sidewall of the gate structure;
forming a recess extending into the semiconductor substrate adjacent to the gate structure, wherein the recess comprises a notched portion of the semiconductor substrate that underlies the gate structure and is spaced apart from the gate structure, the notched portion comprises a first sidewall directly contacting an upper surface of the semiconductor substrate and a second sidewall directly contacting the first sidewall of the recess, each of the first and second sidewalls has a linear shape, and the gate electrode overlaps a portion of the recess;
removing at least a portion of the first spacer; and
filling the recess with a stressor that directly contacts a bottom surface of the first spacer,
wherein a contacting interface between the stressor and the bottom surface of the first spacer is not below a lower surface of the gate insulating layer, and
the stressor is a strain-inducing pattern.

22. The method of claim 21, wherein the forming the recess includes performing an anisotropic etch process, whereby the recess extends under the first spacer.

23. The method of claim 21, further comprising forming a nitride layer along the sidewall of the gate structure.

24. The method of claim 21, wherein the first sidewall and the second sidewall of the recess converge at a convergence interface, and
wherein a distance between the lower surface of the gate insulating layer and the convergence interface is from 3 nm to 7 nm.

25. The method of claim 21, further comprising forming a lightly doped drain (LDD) region in the substrate before forming the recess, wherein the first sidewall and the second sidewall of the recess exposes the LDD region.

26. A semiconductor device comprising:
a substrate;
a gate structure disposed on the substrate;
a spacer adjacent to a sidewall of the gate structure; and
a semiconductor layer disposed adjacent to the gate structure and disposed in a recess that extends below an upper surface of the substrate, the semiconductor layer being a strain-inducing pattern,
wherein a portion of the recess underlies the gate structure, and
wherein an interface between the spacer and the semiconductor layer located under the spacer is coplanar with a lower surface of the gate structure,
wherein the semiconductor layer in the substrate comprises a first portion contacting the spacer and a second portion below the first portion,
wherein the first portion comprises a first sidewall having a linear shape and has a width gradually increasing with a depth of the recess, and the second portion comprises a second sidewall having a linear shape and has a width gradually decreasing with the depth of the recess.

27. The semiconductor device of claim 26, wherein the gate structure includes a gate dielectric and a gate electrode over the gate dielectric.

28. The semiconductor device of claim 26, wherein the semiconductor layer is at least partially disposed directly below the gate structure.

29. The semiconductor device of claim 26, further comprising a lightly doped drain (LDD) region in the substrate, wherein the second portion of the semiconductor layer contacts the LDD region.

30. The semiconductor device of claim 29, wherein the LDD region comprises a first impurity having a p-conductivity type, and the spacer comprises phosphorous (P).

* * * * *